United States Patent
Sivero

(10) Patent No.: US 12,283,300 B2
(45) Date of Patent: Apr. 22, 2025

(54) DEVICES, METHODS, AND SYSTEMS FOR A MULTILEVEL MEMORY CELL

(71) Applicant: Ferroelectric Memory GmbH, Dresden (DE)

(72) Inventor: Stefano Sivero, Comun Nuovo (IT)

(73) Assignee: FERROELECTRIC MEMORY GMBH, Dresden (DE)

(*) Notice: Subject to any disclaimer, the term of this patent is extended or adjusted under 35 U.S.C. 154(b) by 178 days.

(21) Appl. No.: 18/074,101

(22) Filed: Dec. 2, 2022

(65) Prior Publication Data
US 2024/0185903 A1 Jun. 6, 2024

(51) Int. Cl.
G11C 11/22 (2006.01)

(52) U.S. Cl.
CPC ........ *G11C 11/221* (2013.01); *G11C 11/2273* (2013.01); *G11C 11/2275* (2013.01)

(58) Field of Classification Search
CPC .......... G11C 11/221; G11C 11/2273; G11C 11/2275
See application file for complete search history.

(56) References Cited

U.S. PATENT DOCUMENTS

| | | | |
|---|---|---|---|
| 10,546,629 B1* | 1/2020 | Vimercati | G11C 11/2275 |
| 10,978,129 B1 | 4/2021 | Müller | |
| 11,049,541 B2 | 6/2021 | Müller | |
| 11,081,159 B1 | 8/2021 | Jähne et al. | |
| 11,101,291 B2 | 8/2021 | Mennenga et al. | |
| 11,158,361 B2 | 10/2021 | Müller | |
| 11,189,331 B1 | 11/2021 | Benoist et al. | |
| 11,195,589 B1 | 12/2021 | Ocker et al. | |
| 11,244,715 B1* | 2/2022 | Vimercati | G11C 11/2293 |
| 11,289,145 B2 | 3/2022 | Ocker | |
| 11,309,034 B2 | 4/2022 | Mennenga et al. | |
| 11,309,792 B2 | 4/2022 | Iqbal et al. | |
| 11,309,793 B2 | 4/2022 | Iqbal | |
| 11,335,391 B1 | 5/2022 | Ocker | |
| 11,380,400 B2 | 7/2022 | Noack | |
| 11,380,695 B2 | 7/2022 | Ocker | |
| 11,387,254 B2 | 7/2022 | Noack | |
| 11,393,518 B1 | 7/2022 | Ocker | |
| 11,437,402 B2 | 9/2022 | Noack | |
| 11,443,792 B1 | 9/2022 | Iqbal et al. | |
| 11,475,935 B1 | 10/2022 | Ocker | |
| 11,508,426 B1 | 11/2022 | Ocker | |
| 11,508,428 B2 | 11/2022 | Noack et al. | |
| 11,508,756 B2 | 11/2022 | Mennenga et al. | |
| 11,527,551 B2 | 12/2022 | Ocker | |
| 11,594,271 B2 | 2/2023 | Noack et al. | |

(Continued)

*Primary Examiner* — Han Yang
(74) *Attorney, Agent, or Firm* — Synergy IP Group AG; Natalie Albrecht

(57) ABSTRACT

Disclosed herein are devices, methods, and systems for reading/writing memory cells of a memory, where the memory cells includes a memory element that is writable to at least three different remanent polarization states. A sensing circuit determines, in a read operation, a stored state of the memory element from among the at least three different remanent polarization states based on a sensed change in a remanent polarization of the memory element caused by an applied read voltage. A biasing circuit applies, in a write operation, apply a bias voltage level across the memory element to (re)write the memory element to the stored state.

20 Claims, 18 Drawing Sheets

(56) References Cited

U.S. PATENT DOCUMENTS

| | | |
|---|---|---|
| 11,594,542 B2 | 2/2023 | Polakowski |
| 11,605,435 B2 | 3/2023 | Schenk |
| 11,610,903 B2 | 3/2023 | Schenk |
| 11,626,164 B2 | 4/2023 | Noack |
| 11,682,461 B2 | 6/2023 | Mennenga et al. |
| 11,688,447 B2 | 6/2023 | Ocker |
| 2016/0343422 A1* | 11/2016 | Marotta ............. G11C 11/2273 |
| 2022/0122995 A1 | 4/2022 | Ocker et al. |
| 2022/0122996 A1 | 4/2022 | Ocker et al. |
| 2022/0139932 A1 | 5/2022 | Polakowski |
| 2022/0139934 A1 | 5/2022 | Müller |
| 2022/0139937 A1 | 5/2022 | Müller et al. |
| 2022/0270659 A1 | 8/2022 | Ocker |
| 2022/0374202 A1 | 11/2022 | Villa et al. |
| 2022/0376114 A1 | 11/2022 | Müller |
| 2023/0041759 A1 | 2/2023 | Noack et al. |
| 2023/0046259 A1 | 2/2023 | Iqbal |
| 2023/0135718 A1 | 5/2023 | Minh et al. |
| 2023/0170029 A1 | 6/2023 | Sivero |
| 2023/0189531 A1 | 6/2023 | Müller |
| 2023/0189532 A1 | 6/2023 | Müller |
| 2023/0223066 A1 | 7/2023 | Müller |
| 2023/0247842 A1 | 8/2023 | Müller |
| 2023/0284454 A1 | 9/2023 | Ocker et al. |
| 2023/0335174 A1 | 10/2023 | Kuzmanov |
| 2023/0360684 A1 | 11/2023 | Sivero |
| 2023/0371268 A1 | 11/2023 | Müller |
| 2023/0402083 A1 | 12/2023 | Schenk |
| 2024/0032305 A1 | 1/2024 | Kashir et al. |
| 2024/0032306 A1 | 1/2024 | Ocker |
| 2024/0032307 A1 | 1/2024 | Müller et al. |
| 2024/0172451 A1 | 5/2024 | Schenk |

* cited by examiner

DEVICES, METHODS, AND SYSTEMS FOR A MULTILEVEL MEMORY CELL

TECHNICAL FIELD

This disclosure relates to non-volatile memories, and in particular, to memories that include state-programmable memory elements for storing the information.

BACKGROUND

Non-volatile memories allow for storing information in a memory, where the stored information is retained in the memory even after external power to the memory has been removed. Memories are typically formed from a number of memory cells, where each memory cell is able to store one bit of digital (e.g., binary) information (e.g., each memory cell may be written to a value representing a "0" or to a value representing a "1"). Among other components, memory cells may include a state-programmable memory element (e.g., a ferroelectric memory element such as a ferroelectric capacitor) that is capable of retaining the written information based on a programmed state that is retained even after its power source has been removed. The information stored in a memory cell may be read out at later time, and its state may be programmed to change the stored information (e.g., "erased" or "programmed" to hold a "1" or a "0"). Because a typical memory element only represents one bit of information (e.g., either a "0" or a "1"), memory capacity may be directly proportional to and limited by the number of memory elements in the memory.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
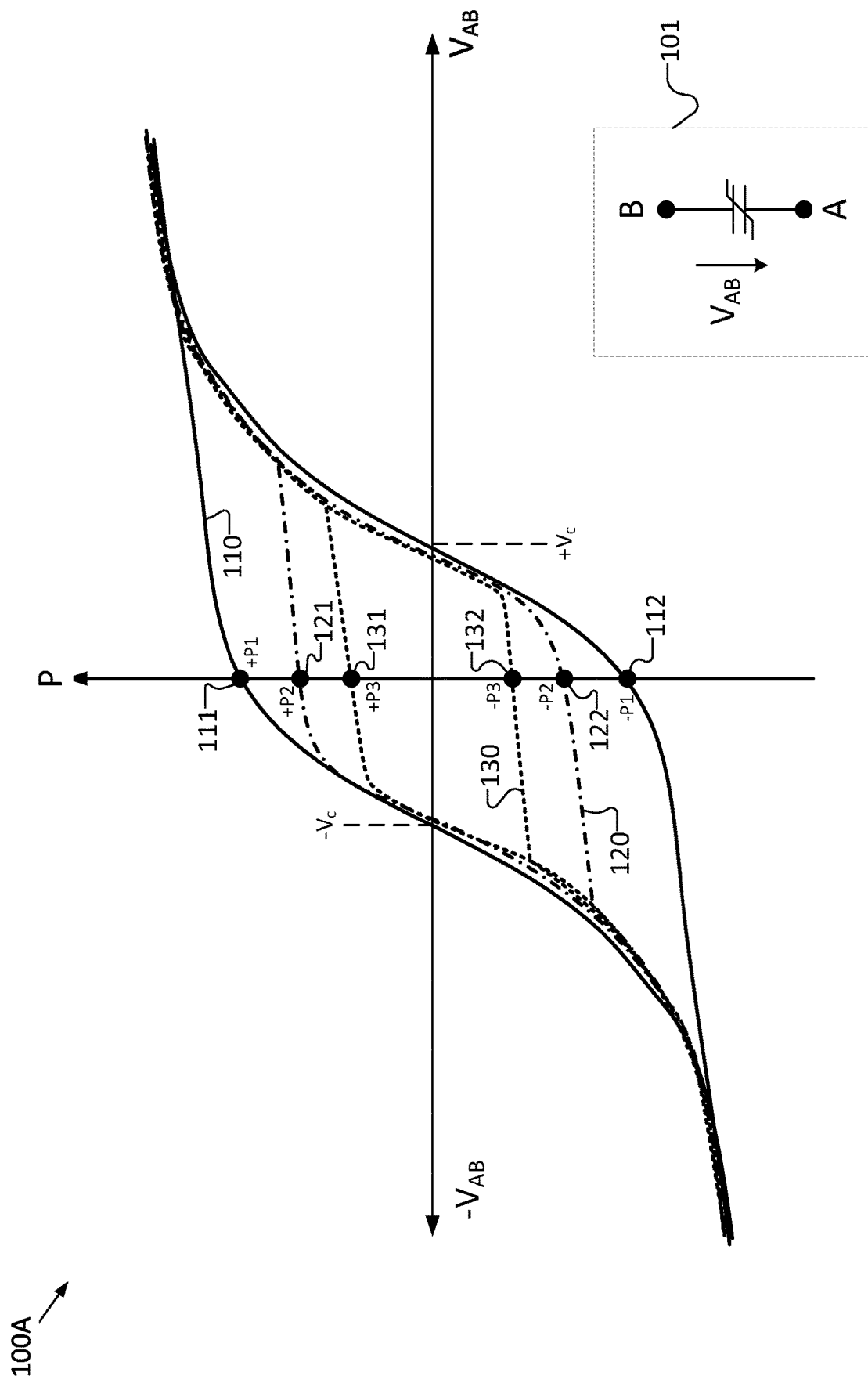
FIGS. 1A-1C each show an exemplary graph of the polarization of a multilevel state-programmable memory element as a function of the voltage applied across it.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices. However, it may be understood that aspects described in connection with methods may similarly apply to the devices, and vice versa.

In general, non-volatile memories are typically formed from a number of memory cells, where each memory cell is able to store a single bit of digital information (e.g., each memory cell may be written to one of two binary states: a first state representing the off state (e.g., "0") and a state representing the on state (e.g., "1")). The individual memory cells that form the memory are typically organized into control groupings of cells, where each cell may be individually addressed but have a common control scheme for biasing the cells via control lines such as bit lines (e.g., for operating the cells grouped in the same column), word lines (e.g., for operating cells grouped in the same row), and/or plate lines (e.g., for operating cells grouped to as to share a common node such as a same "plate"). Among other components, memory cells may include a state-programmable memory element (e.g., a ferroelectric memory element such as a ferroelectric capacitor) that is capable of retaining the written information by writing one of two remanent states of the memory element. As used throughout this disclosure, a state of a memory element is described as "remanent" where the memory element it is capable of retaining its programmed state even when it is not connected to a power source. As also used throughout, the current remanent state to which the memory element has been set may be referred to as the "stored" state, the "written" state, or the "programmed" state. As should be understood, when referring to a state-programmable memory element, the terms "write," "store," or "program" are used generically to refer to setting the remanent state of state-programmable memory element. As is understood, the term "voltage" may be used herein with respect to "a bit line voltage", "a word line voltage," "a plate line voltage," and the like. The "voltage across" a component may be used herein to denote a voltage drop from a node on one side of a component (e.g. one side of a capacitor) to a node on the other side of the component (e.g., the other side of the capacitor).

When a state-programmable memory element includes ferroelectric material (e.g., a ferroelectric capacitor), the remanent state is understood as referring to a remanent polarization state that is set by applying a particular voltage across the element that is sufficient to set a corresponding polarization state, where, once set, the remanent polarization state is retained by the element even when the voltage across the element has been removed (e.g., it is remanently-polarizable). Once such an element has been state-programmed to a remanent state, it generally retains the programmed state until it is re-programmed by applying a voltage across it that is sufficient to program the element to a (e.g., new) remanent state. A polarization capability of a state-programmable memory element (e.g., remanent polarization capability, e.g., non-remanent spontaneous polarization capability) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

As noted above, a typical memory includes multiple memory cells where each memory cell contains a memory element that represents only one bit of information (e.g., either a "0" or a "1") by being programmable to one of two states, each state corresponding to one of the two values. As a result, memory capacity may be directly proportional to and limited by the number of memory elements in the memory. In contrast to conventional memories, disclosed below are improved memories, systems, and methods that include multilevel state-programmable memory elements, each of which may store more than a single bit of information. As disclosed in more detail below, each such multilevel state-programmable memory element may be remanently state-programmable to more than two different states (e.g., three states, four states, six states, ten states, etc.), where each programmable state may represent different stored information.

For example, using digital (e.g., binary) information as an example, a single multilevel state-programmable memory element that is programmable to four different states may be able to represent two bits of binary data. As an example, the first state may represent two bits with a value of "00", the second state may represent two bits with a value of "01", the third state may represent two bits with a value of "10", and the fourth state may represent two bits with a value of "11". By using one or more such multilevel state-programmable memory elements, the bit density (e.g., the number of bits storable per memory element) may increase such that the memory's capacity is not necessarily directly proportional the number of memory elements in the memory, leading to a potential efficiency improvement in terms of, for example, storage capacity per area. As should be appreciated, the number of available states to which a multilevel state-programmable memory element may be programmed may determine the number of bits a given memory element is able to represent. For example, a multilevel state-programmable memory element with $2^n$ different states may be able to represent up to n bits of binary data. Of course, as should be appreciated, while a binary coding scheme is provided as an example throughout this disclosure, any coding scheme could be used to associate one or more of the multiple different remanent states with a corresponding representation of a bit, combinations of bits, or other information.

As used throughout, a state-programmable memory element may be understood as any element that is able to remanently store at least two remanent states, which may include, for example a ferroelectric element (e.g., a remanently-polarizable capacitor (e.g., a ferroelectric capacitor)). A state-programmable memory element may also be designed to have more than two remanent states. A remanently-polarizable capacitor, for example, may be designed to have more than two different remanent polarization states, where the capacitance depends on to which of the remanent polarization states the capacitor has been programmed/written. Such a capacitor may be called a "multilevel" ferroelectric capacitor. As with remanently-polarizable capacitors with only two remanent states, the multiple different remanent polarization states may be programmed/written by applying a particular voltage across the capacitor that is sufficient to program/write the corresponding remanent polarization state. An exemplary multilevel remanently-polarizable capacitor that is state-programmable to six different remanent polarization states is used as the basis for the graph shown in FIG. 1.

FIG. 1A shows a graph 100A of the polarization (P) of a multilevel state-programmable memory element (e.g., multilevel remanently-polarizable capacitor 101) as a function of the voltage applied across it (e.g., a voltage drop ($V_{AB}$) from a node (A) on one side of the capacitor to a node (B) on the other side of capacitor). As should be appreciated, the voltage drop over the capacitor may vary from a negative value ($-V_{AB}$, to the left of the polarization axis (Y-axis)) to a positive value ($+V_{AB}$, to the right of the polarization axis), where the axis crossing indicates zero voltage drop over the capacitor. The multilevel remanently-polarizable capacitor in the example in FIG. 1A should be understood to have six different remanent polarization states, defined by three pairs of positive/negative remanent polarization states, each pair of states being associated with a hysteresis curve depicting the polarization (P) as a function of the applied voltage ($V_{AB}$) across the remanently-polarizable capacitor. As should be understood, in order to program one of the negative remanent polarization states, a negative voltage greater than the negative coercive voltage ($-V_c$) must be applied (e.g., a more negative voltage, leftwards on the graph), and in order to program one of the positive remanent polarization states, a positive voltage greater than the positive coercive voltage ($+V_c$) must be applied (e.g., a more positive voltage, rightwards on the graph).

In particular, hysteresis curve 110 (solid line) is associated with the pair of remanent polarization points that include positive polarization point 111 (e.g., with a polarization of +P1) and negative polarization point 112 (e.g., with a polarization of −P1). Similarly, hysteresis curve 120 (dot-dashed line) is associated with the pair of remanent polarization points that include positive polarization point 121 (e.g., with a polarization of +P2) and negative polarization point 122 (e.g., with a polarization of −P2). Finally, hysteresis curve 130 (dotted line) is associated with the pair of remanent polarization points that include positive polarization point 131 (e.g., with a polarization of +P3) and negative polarization point 132 (e.g., with a polarization of −P3). Thus, after a voltage is applied across the capacitor and the voltage across the capacitor ($V_{AB}$) returns to zero, the polarization of the capacitor will retain one of the six remanent polarization states/points (e.g., 111, 121, 131, 112, 122, 132), depending on the starting remanent polarization state and/or the applied voltage.

In general, as various voltages are applied across the capacitor, the polarization of the capacitor will follow the hysteresis curve associated with its starting remanent polarization state. That is, until the applied voltage across the capacitor reaches a threshold voltage sufficient to program the capacitor to a different remanent polarization state associated with a different hysteresis. For a given remanent polarization state of the capacitor, it may have an associated minimum threshold voltage that must be met or exceeded in order to program the capacitor to that given remanent polarization state. Examples of six such remanent polarization states, each corresponding to one of six minimum threshold voltages necessary to set that state are shown in graph 100B of FIG. 1B, which is the same as graph 100A but with additional markings. As indicated by the markings in FIG. 1B, $+V_{s_2}$ is the minimum positive voltage necessary to program the capacitor to positive remanent polarization state 121, $+V_{s_1}$ is the minimum positive voltage necessary to program the capacitor to positive polarization state 111, $-V_{s_2}$ is the minimum negative voltage necessary to program the capacitor to positive remanent polarization state 121, and $-V_{s_3}$ is the minimum negative voltage necessary to program the capacitor to negative remanent polarization state 132.

Thus, for purposes of an example and assuming the starting remanent polarization state is positive polarization state 131, if a positive voltage is applied across the capacitor, the polarization will move from 131 along hysteresis curve 130 (dotted line) and return to the positive polarization state 131 when no voltage is applied. However, if the applied voltage reaches or exceeds $+V_{s_2}$, the capacitor will be programmed to the positive polarization state 121 and if the applied voltage changes thereafter, the polarization will move along hysteresis curve 120 (dot-dashed line). Of course, should the applied voltage reach or exceed $+V_{s_1}$, the capacitor will be programmed to the positive polarization state 111 and as the applied voltage changes thereafter, the polarization will move along hysteresis curve 110 (solid line). As should be appreciated, each remanent polarization state may effectively have a range of applied voltage thresh-old voltages that, when applied, will program the capacitor to the corresponding remanent polarization state (e.g., at or above a minimum threshold voltage level but below a maximum threshold voltage level that may be the minimum threshold voltage level of the next remanent polarization state).

The same is true in the negative direction such that as an increasingly negative voltage is applied across the capacitor, the polarization will continue to the follow the hysteresis curve associated with its currently-programmed remanent polarization state, until the voltage across the capacitor reaches a minimum threshold voltage sufficient to program the capacitor to another remanent polarization state. Assuming that the capacitor is currently programmed to the positive polarization state 111 (+P1) and thus, as the voltage across the capacitor changes, the polarization will move along hysteresis curve 110 (solid line). Starting from where there is zero voltage across the capacitor (e.g., the axis intersection), if a negative voltage is applied, the polarization will continue to move along hysteresis curve 110 (solid line). If the voltage across the capacitor reaches or exceeds, for example, $-V_{s_2}$, this will program the capacitor to the positive polarization state 122 (+P2). Thereafter, changes in the voltage across the capacitor will follow hysteresis curve 130 until a voltage is applied across the capacitor that reaches or exceeds a threshold voltage associated with a different remanent polarization state. As another example, if the voltage across the capacitor reaches or exceeds $-V_{s_3}$, this will program the capacitor to the negative polarization state 132 (−P3).

Figure 1B:
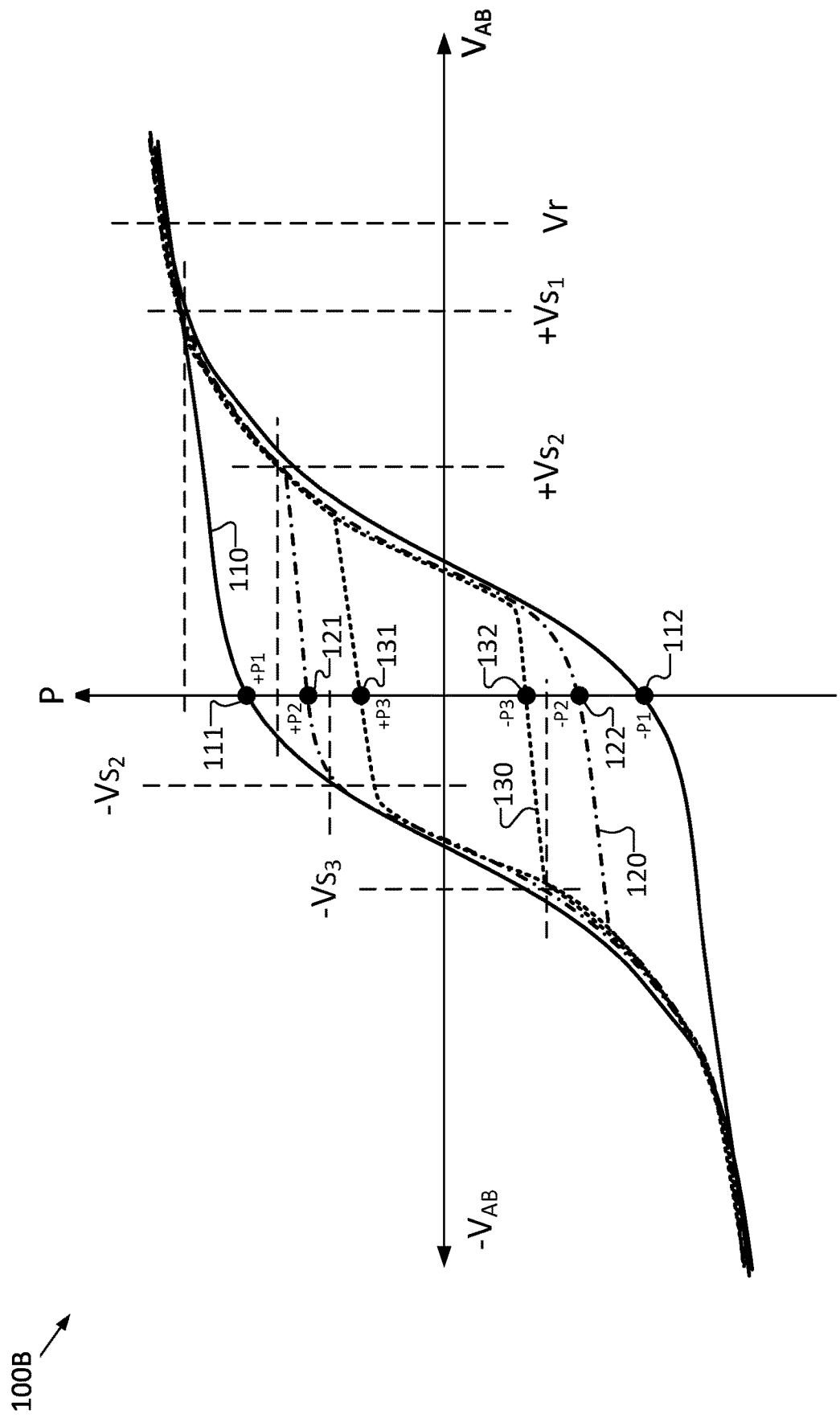

Though not all threshold voltages are marked in FIG. 1B, it should be understood that each remanent polarization state of the capacitor will be associated with a minimum positive threshold voltage and a minimum negative voltage threshold that, if the applied voltage meets or exceeds the threshold voltage, is sufficient to program the corresponding remanent polarization state.

With this functionality in mind, a memory may utilize a single multilevel state-programmable memory element that is capable of being remanently-polarized to more than two states, such as a multilevel remanently-polarizable capacitor, to read/write more than one bit of information to the single memory element. For example, a read circuit may read out the currently-programmed polarization state of a multilevel state-programmable memory element and decode the read value to a corresponding bit or combination of bits associated with each state. In general, to read the currently-programmed polarization state, the read circuit may determine how much charge was added to the sensing system by applying a read voltage across the state-programmable memory element that is sufficient to program a predefined one of the available remanent polarization states. The difference in charge caused by applying the read voltage may then indicate what the currently-programmed polarization state was at the start of the read operation.

Figure 1C:
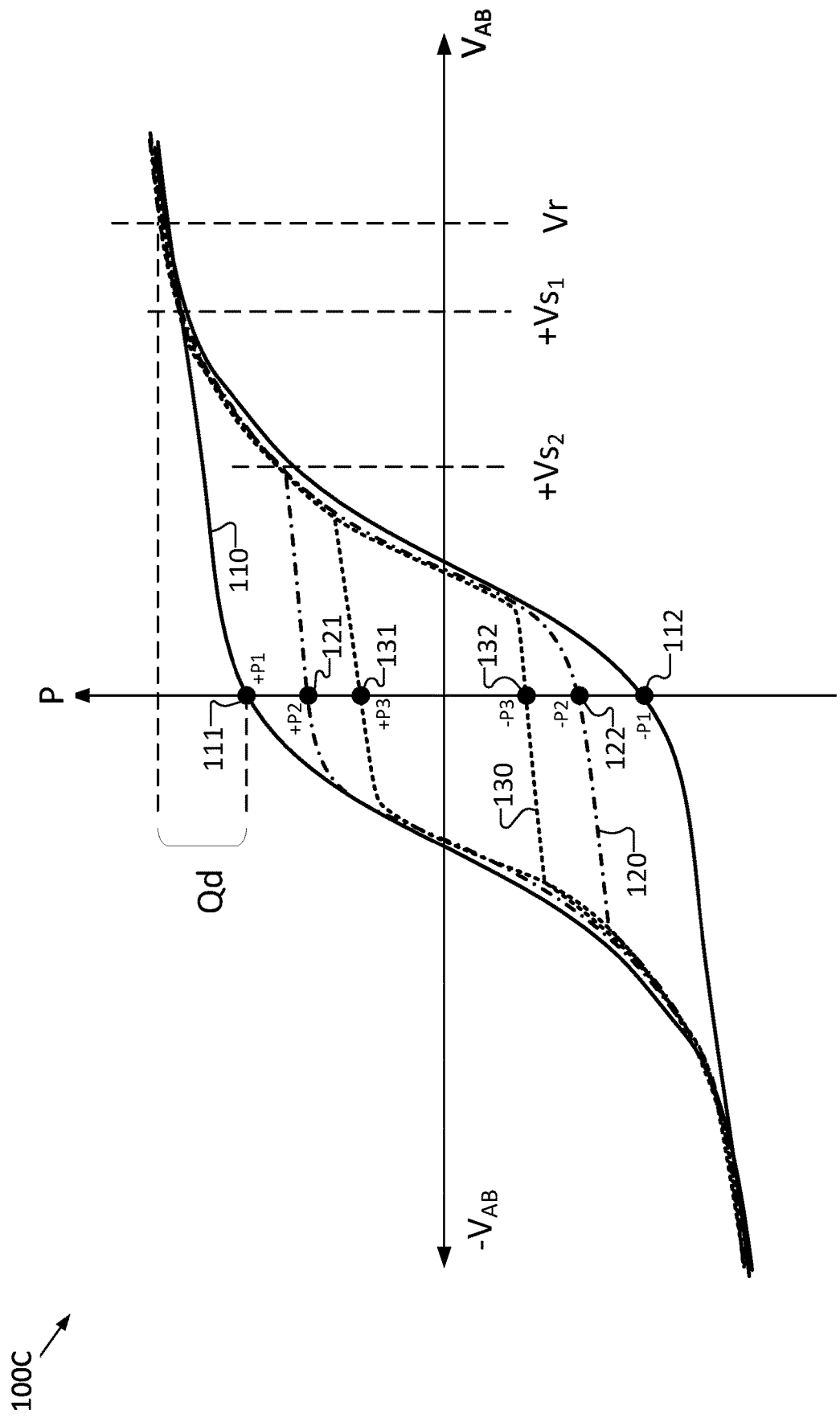

To provide an example, referring now to graph 100C of FIG. 1C, which is the same as graphs 100A and 100B but with different markings, assume that the currently programmed remanent polarization state of the capacitor is negative polarization state 132. Thus, with no voltage applied across the state-programmable memory element, it maintains a negative polarization of −P3. If, as part of the read operation, a read voltage (marked as Vr on graph 100C) is applied across the state-programmable memory element, the charge follows hysteresis 130 until the state-programmable memory element is charged to the polarization associated with Vr. Because Vr meets or exceeds the threshold voltage ($+V_{s_1}$) sufficient to program the highest remanent polarization state 111 (+P1), when Vr is no longer applied across the state-programmable memory element, the charge will return to +P1 at positive polarization state 111 (e.g., the predefined one of the available remanent polarization states used for the read operation). The net charge difference between the initial state (−P3) and the final state (+P1), after the read voltage is applied and then returned to zero, is (+P1)−(−P3)=+P1+P3. Similar charge differences may be calculated, where, depending on the initial remanent state and the final remanent state, a corresponding net charge difference caused by the applied read voltage (e.g., a switching charge (Qsw)) may be determined that indicates the initially-programmed remanent polarization state:

| Initial Remanent State | Charge Difference (Qsw) |
|---|---|
| −P1 | 2P1 |
| −P2 | P1 + P2 |
| −P3 | P1 + P3 |
| +P3 | P1 − P3 |
| +P2 | P1 − P2 |
| +P1 | 0 |

As should be understood, the above-described read operation is an example of an after-pulse read operation, where the net charge difference is determined after the read voltage is applied and removed (e.g., as a pulse). In this case, the voltage across the capacitor returns to zero and the charge of the capacitor is allowed to dissipate back to the newly-programmed state (e.g., the predefined one of the available remanent polarization states used for the read operation) before sensing the net charge difference.

In lieu of an after-pulse read operation, an after-step read operation may be used, where the charge difference is determined while the read voltage is still applied across the capacitor. In an after-step read, the sensed charge difference is between the initial remanent polarization state and the polarization while the read voltage is applied. Similar to the net charge differences discussed above with respect to the after-pulse read operation, the read voltage applied during an after-step read operation may result in a charge difference that indicates the initially-programmed remanent polarization state, except that instead of a net charge difference, it reflects a gross charge difference. In other words, the charge difference caused by the applied read step-voltage is the net charge plus a displacement charge (marked as Qd on graph 100C), where the displacement charge (Qd) is the difference between the polarization at the applied read voltage and the remanent polarization at the newly-programmed state (e.g., the newly programmed state is the predefined read state that is set during the read operation when generating the switching charge (for example, state 111 (+P1, 111 when the applied read voltage is Vr)). The displacement charge (Qd) may be understood as being associated with the dielectric of the remanently polarizable capacitor. Each initial remanent state and its associated charge difference that is sensed using an after-step read operation is shown in the table below:

| Initial Remanent State | Charge Difference (Qsw) |
|---|---|
| −P1 | 2P1 + Qd |
| −P2 | P1 + P2 + Qd |
| −P3 | P1 + P3 + Qd |
| +P3 | P1 − P3 + Qd |
| +P2 | P1 − P2 + Qd |
| +P1 | Qd |

As should be appreciated, the read voltage applied across the capacitor may be any voltage level (positive or negative) that is large enough to meet or exceed a threshold voltage associated with programing the predefined one of the available remanent polarization states. Preferably, the predefined one of the available remanent polarizations states will be one of the highest remanent polarization state pairs (e.g., the most positive remanent polarization state or the most negative remanent polarization state (e.g., with reference to FIG. 1C, positive polarization state 111 (P1) or negative polarization state 112 (−P1))) in order to ensure that the read operation injects a switching charge sufficient to cover all the different possible remanent polarization states that may be used to encode the multiple bits (or other information) that the different states of the memory element are designed to represent.

Once the read circuit has sensed/determined the charge difference caused by the applied read voltage, it may also decode the determined charge difference into the associated representation of stored information. For example, as noted above, the stored information may represent multiple bits (e.g., two, three, four, etc. bits of information, depending on the number of available states). So, if the memory is designed so that a single memory element is able to hold three bits of data, the read circuit may need to distinguish among at least eight different charge differences that may then be decoded into eight different bit representations (e.g., one of binary codes "000", "001", "010", "011", "100", "101", "110", and "111"). If the memory is designed so that a single memory element is able to hold two bits of data, for example, the read circuit may need to distinguish among at least four different charges that may be decoded into four different bit representations (e.g., binary codes "00", "01", "10", and "11").

Returning to the plot depicted in FIG. 1C of an exemplary memory element with six remanent states, if the memory element is used to store two bits, four of the six remanent states may be used to represent the four possible bit representations. An example of one such coding scheme and the possible association between the programmed state (e.g., the "initial state" or "stored state" of the memory element at the beginning of the read operation), the switching charge that may be caused by applying a read voltage to read the memory element (e.g., using either an after-step read operation or an after-pulse read operation), and its corresponding binary code representation are shown in the table below.

| Initial State (stored) | Charge Difference (after-step read) | Charge Difference (after-pulse read) | Binary Code |
|---|---|---|---|
| −P1 | 2P1 + Qd | 2P1 | 1 0 |
| −P2 | P1 + P2 + Qd | P1 + P2 | 1 1 |
| −P3 | P1 + P3 + Qd | P1 + P3 | 0 1 |
| +P3 | P1 − P3 + Qd | P1 − P3 | (not used) |
| +P2 | P1 − P2 + Qd | P1 − P2 | (not used) |
| +P1 | Qd | 0 | 0 0 |

As should be understood, associations are possible that uniquely relate an initial programmed state to a corresponding detected charge difference and binary code representation. A different example that uses three positive states and one negative state is shown in the table below:

| Initial State (stored) | Charge Difference (after-step read) | Charge Difference (after-pulse read) | Binary Code |
|---|---|---|---|
| −P1 | 2P1 + Qd | 2P1 | (not used) |
| −P2 | P1 + P2 + Qd | P1 + P2 | (not used) |
| −P3 | P1 + P3 + Qd | P1 + P3 | 1 0 |
| +P3 | P1 − P3 + Qd | P1 − P3 | 1 1 |
| +P2 | P1 − P2 + Qd | P1 − P2 | 0 1 |
| +P1 | Qd | 0 | 0 0 |

As a further example, a memory element may be used that has only four polarization states (e.g., two positive/negative pairs of remanently-polarizable states, where each pair is associated with one of two hysteresis curves). With this type of memory element, the stored polarization states may be utilized symmetrically to represent one of four binary codes:

| Initial State (stored) | Charge Difference (after-step read) | Charge Difference (after-pulse read) | Binary Code |
|---|---|---|---|
| −P1 | 2P1 + Qd | 2P1 | 0 1 |
| −P2 | P1 + P2 + Qd | P1 + P2 | 1 1 |
| +P2 | P1 − P2 + Qd | P1 − P2 | 0 1 |
| +P1 | Qd | 0 | 0 0 |

The reading circuit may include a sensing circuit to sense the charge difference (e.g., the switching charge) transferred by the memory element during the read operation, convert it to a sensed voltage, and then compare this sensed voltage to reference voltage(s) that correspond to the different stored polarization states. Based on the comparison, the reading circuit may determine which state was the initially-programmed state (and therefore the binary code). The switching charge may be sensed and converted to a sensed voltage level using, for example, a voltage sensing scheme or a charge sensing scheme, examples of each of which are shown in FIG. 2 and FIG. 3, respectively.

Figure 2:
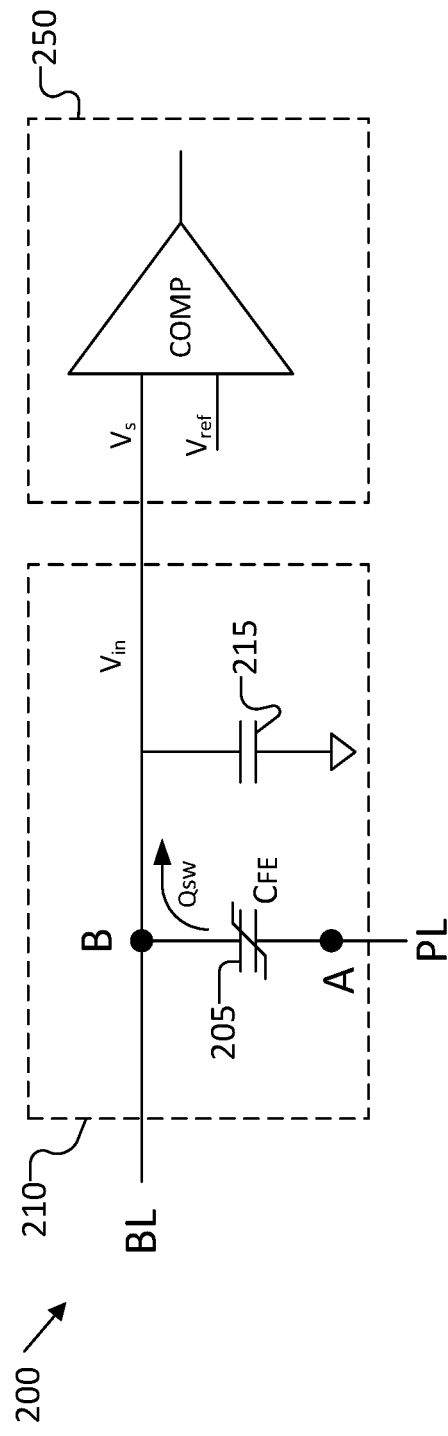
FIG. 2 illustrates an exemplary sensing circuit that uses a voltage sensing scheme to convert a switching charge to a sensed voltage level.

FIG. 2 shows an exemplary voltage sensing scheme, where a sensing circuit 200 includes a voltage conversion circuit 210 that is configured to sense the charge difference (e.g., the switching charge Qsw) transferred by a memory element (e.g., ferroelectric capacitor 205) during the read operation to an input capacitance (e.g. capacitor 215). In this example, the read voltage is applied by means of a bit line voltage (BL) and a plate line voltage (PL) on opposite sides of the ferroelectric capacitor 205. As should be appreciated, the memory cell may be configured in other ways to provide the read voltage across the ferroelectric capacitor 205 via any other control lines (e.g., bit lines, word lines, etc.) in any other combination. The voltage developed across the input capacitor 215 (Vin) may then be input as a sensed voltage (Vs) into a comparator 250 for comparing to one or more reference voltages (Vref) that correspond to the programmed state that was read. The comparator (e.g., comparator 250) used to determine the programmed state will be discussed in more detail below.

Figure 3:
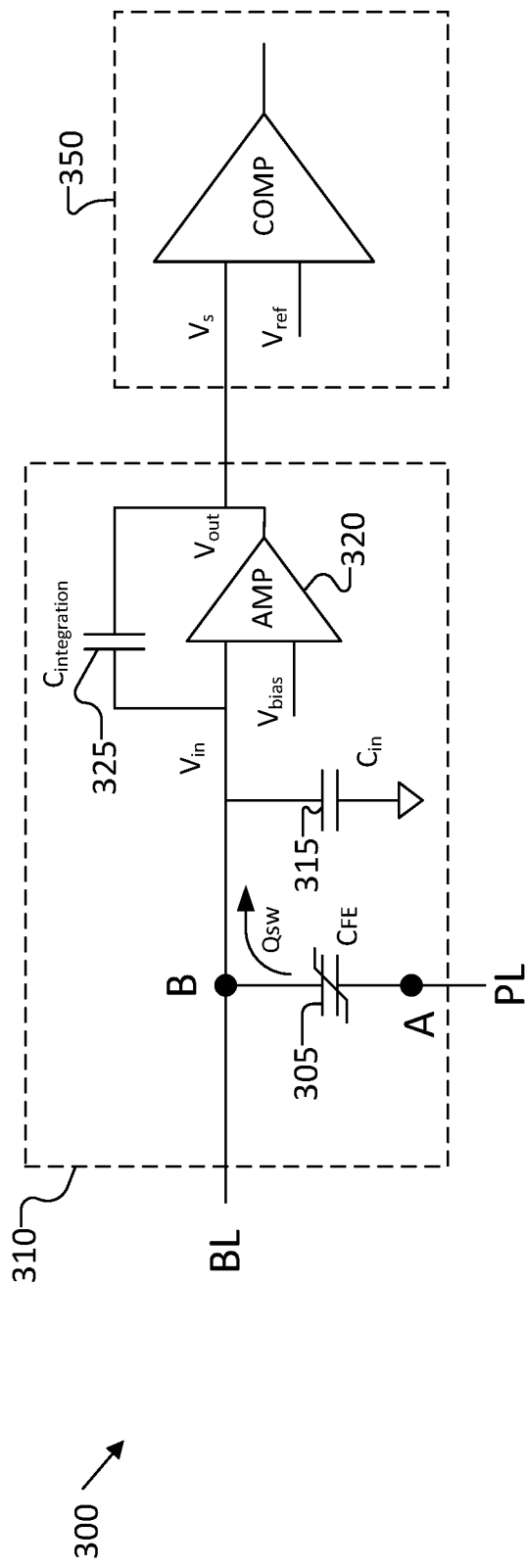
FIG. 3 depicts an exemplary sensing circuit that uses a charge sensing scheme to convert a switching charge to a sensed voltage level.

FIG. 3 shows an exemplary charge sensing scheme, where a sensing circuit 300 includes a voltage conversion circuit 310 that is configured to integrate the charge difference (e.g., the switching charge Qsw) transferred by memory element (e.g., ferroelectric capacitor 305) during the read operation over a virtual ground node at Vin (e.g., set by capacitor 315). In this example, the read voltage is applied by means of a bit line voltage (BL) and a plate line voltage (PL) on opposite sides of the ferroelectric capacitor 305. As should be appreciated, the memory cell may be configured in other ways to provide the read voltage across the ferroelectric capacitor 305 via any other control lines (e.g., bit lines, word lines, etc.) in any other combination. The switching charge (Qsw) transferred via the virtual ground node at Vin is fed into an integration system (e.g., an amplifier 320 with an integration capacitor 325) that provides an integrated output voltage (Vout) representing the switching charge. This output voltage may then be input as a sensed voltage (Vs) into a comparator 350 for comparing to one or more reference voltages (Vref) that correspond to the programmed state that was read. The comparator (e.g., comparator 350) used to determine the programmed state will be discussed in more detail below.

Figure 4:
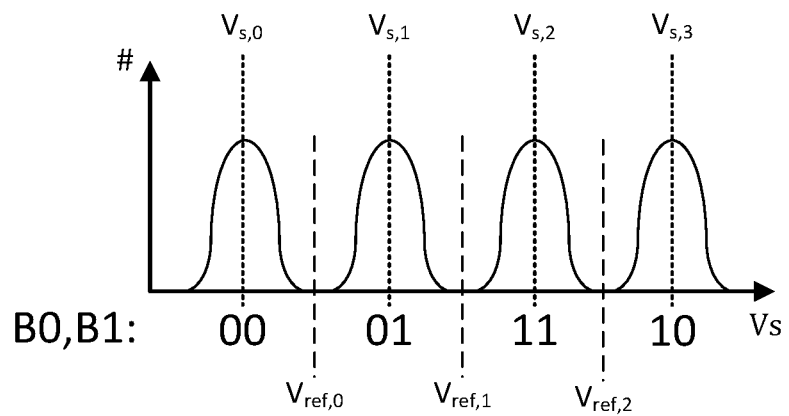
FIG. 4 shows example distributions of switching charges and corresponding sensed voltages that may result as part of a read operation.

FIG. 4 shows an example of how the switching charge may relate to a corresponding sensed voltage that may be compared to one or more reference voltage to determine the programmed stated that was read during the read operation. Graph 401 depicts a distribution of switching charges that may be injected into a sensing circuit during a read operation, where the center of a switching charge distribution corresponds to the programmed state that was read. As should be appreciated, each state-programmable memory element may have slight variations in the switching charge delivered in a given read operation, depending, for example, on various factors such as aging, drift, temperature, burn-in, which polarization states are used, etc. As such, the switching charge for a given remanent polarization state may be represented by a charge distribution over a range of switching charges centered at a median value (e.g., a median of $Q_{sw,0}$ associated with one remanent state; a median of $Q_{sw,1}$ associated with a second remanent state; a median of $Q_{sw,2}$ associated with a third remanent state; and a median of $Q_{sw,3}$ associated with a forth remanent state). As should be appreciated, the charge distributions may not necessarily be uniform or uniformly spaced and may overlap. However, it should be understood that a tighter distribution and wider spacing may provide for a more accurate sensing of the switching charge and therefore the programmed state.

Graph 402 depicts the distribution of sensed voltages that have been converted (e.g., using a voltage sensing scheme or charge sensing scheme described above with respect to FIGS. 2-3) from the corresponding distribution of switching charges shown in graph 401. The spacing between sensed voltage distributions may then be used by a comparator in order to determine which of the programmed states is represented by the sensed voltage. For example, $V_{ref,0}$ may be selected as a reference voltage delineating $V_{s,0}$ and $V_{s,1}$, where voltages that are below $V_{ref,0}$ correspond to a read state associated with the binary code of "00," where the stored state of a multilevel memory cell represents a two-bit binary code (e.g., B0, B1). $V_{ref,1}$ may be selected as a reference voltage delineating $V_{s,1}$ and $V_{s,2}$, where voltages that are below $V_{ref,1}$ and above $V_{ref,0}$ correspond to a read state associated with the binary code of "01." $V_{ref,2}$ may be selected as a reference voltage delineating $V_{s,2}$ and $V_{s,3}$, where voltages that are below $V_{ref,3}$ and above $V_{ref,2}$ correspond to a read state associated with the binary code of "11," and voltages above $V_{ref,3}$ correspond to a read state associated with the binary code of "10." As with the charge distributions, the corresponding voltage distributions may not necessarily be uniform or uniformly spaced and may overlap. However, it should be understood that a tighter distribution and wider spacing may allow for reference voltages to be selected that provide for a more accurate determination of the programmed state.

As should be appreciated, the switching charge (and the associated sensed voltages) may also fluctuate over temperature. As such, a temperature compensation circuit may be used when generating the reference voltages so as to track the temperature dependency of the switching charge (e.g., the polarization state) and thus the associated sensed voltages. Additionally or alternatively, a temperature compensation circuit may be used when generating the bias voltages (e.g., the bit line bias voltages) that are discussed later in this disclosure.

Figure 5:
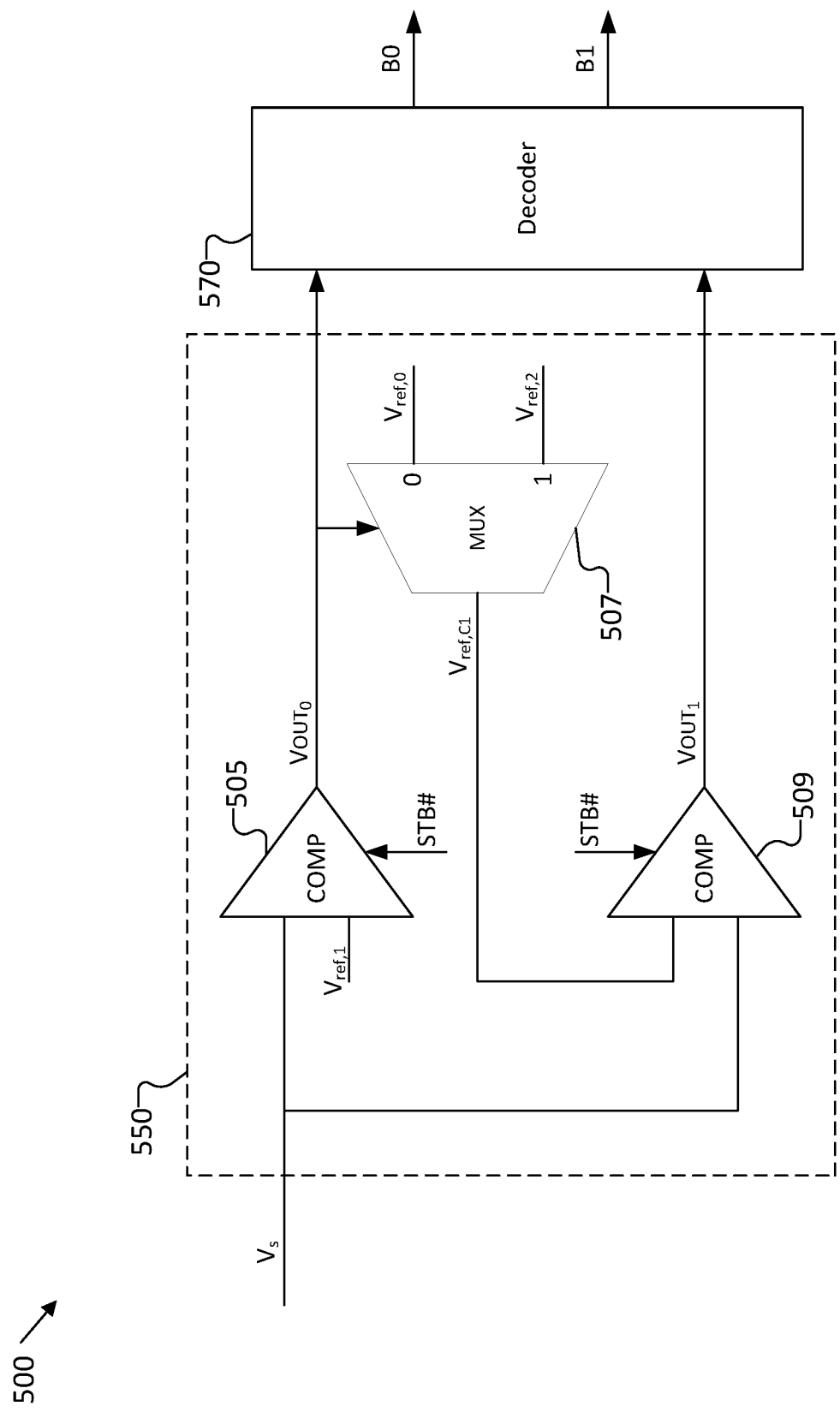
FIG. 5 shows an exemplary circuit for determining, based on a sensed voltage, the read state of a multilevel memory cell and the binary code that the read state represents.

FIG. 5 shows an example circuit 500 of a comparator 550 and decoder 570 that may, based on the sensed voltage (e.g., Vs), determine the read state of the multilevel state-programmable memory element and the binary code that the read state represents. The example in FIG. 5 may be used, for example, to distinguish among the four possible states of the memory element from among its corresponding switching charge distributions 401 and sensed voltage distributions 402 shown in FIG. 4. For example, the sensed voltage may be the output of a voltage conversion circuit (e.g., the voltage conversion circuit 210, 310), as shown, for example, in FIGS. 2 and 3, that senses the switching charge (Qsw) transferred during the read operation. For example, comparator 550 may compare the sensed voltage Vs to a number of different reference voltages (e.g., $V_{ref,0}$, $V_{ref,1}$, $V_{ref,2}$, etc.), and based on the comparison(s), determine the binary code that the sensed voltage (and therefore the read state) represents.

As shown in the exemplary circuit 500, the sensed voltage and one of the reference voltages (e.g., $V_{ref,1}$, where, with reference to FIG. 4 and sensed voltage distribution 402, $V_{ref,1}$ represents the threshold voltage level below which the sensed voltage will correspond to the first or second states (e.g., binary code 00 or binary code 01) and above which will correspond to the third or fourth states (e.g., binary code 11 or binary code 10). Thus, the output of the comparator 505 may feed into a decoder 570 for selecting, in this example, the leftmost bit of the binary code (e.g., determining whether the B0 bit is "0" or "1"). The output of the comparator 505 may also feed into a multiplexer 507 as a selection signal for selecting one of the two remaining reference voltages (e.g., to select between $V_{ref,0}$ and $V_{ref,2}$, where $V_{ref,0}$ is selected if the output of the comparator 505 indicates Vs is below $V_{ref,1}$, and $V_{ref,2}$ is selected if the output of the comparator 505 indicates Vs is above $V_{ref,1}$.

The output of the multiplexer 507 (e.g., $V_{ref,C1}$) may then be provided as a selected reference voltage to a second comparator 509 for comparing it with Vs. The selected reference voltage from the multiplexer 507 represents the threshold voltage level below which the sensed voltage will correspond to the first or third states (e.g., binary code 00 or binary code 11) and above which will correspond to the second or fourth states (e.g., binary code 01 or binary code 10). Thus, the output of the comparator 509 may feed into decoder 570 for selecting, in this example, the rightmost bit of the binary code (e.g., determining whether B1 bit is "0" or "1"). In this particular example, the comparators use strobe line(s) (STB #) so that information for the bits may be obtained at different times. So, for example, the one bit (B0) (e.g., a least significant bit) may be retrieved from comparator 505 after the first strobe whereas the next bit (B1) (e.g., a most significant bit) may be obtained from comparator 509 after the second strobe. This means that, especially where the bits B0 and B1 belong to two different logic "pages," reading of the least significant bit (B0) may be shorter because the least significant bit page (with B0) may be read after first strobe and may be output to a control logic outside the sense amplifier or even out of the memory array before the second strobe. This may help reduce latency time (e.g., a shorter read time) for reading bits on the least significant bit page, as one example.

As should be appreciated, this is merely one example of a comparator for differentiating among four different states of the memory element represented by the sensed voltage, and it may be extended in a similar manner to any number of states with any type of encoding. For example, three comparators may be used instead the two shown in FIG. 5, where each comparator compares the sensed voltage (Vs) to one of the three different reference voltages ($V_{ref,0}$, $V_{ref,1}$, $V_{ref,2}$). As should be understood, a three-comparator implementation may require additional chip-area as compared to the two-comparator solution of FIG. 5.

As should be appreciated from the read operations described above, the read operation may be destructive in the sense that in order to generate and detect a switching charge, the read operation applies a voltage across the state-programmable memory element sufficient to program it to a remanent state. In other words, because the read operation programs the state-programmable memory element to a remanent state (e.g., to the predefined read state), the read operation will overwrite the remanent state. Thus, in order to return the memory element to its initially-programmed state, a write operation may be necessary after the read operation to rewrite the state-programmable memory element back to its initially-programed state. After the read state is determined (e.g., after the read operation has decoded the sensed voltage into the bits represented by the read state), this may be written back to the state-programmable memory element in a write operation (also called a "write-back" or "rewrite" operation).

Figure 6:
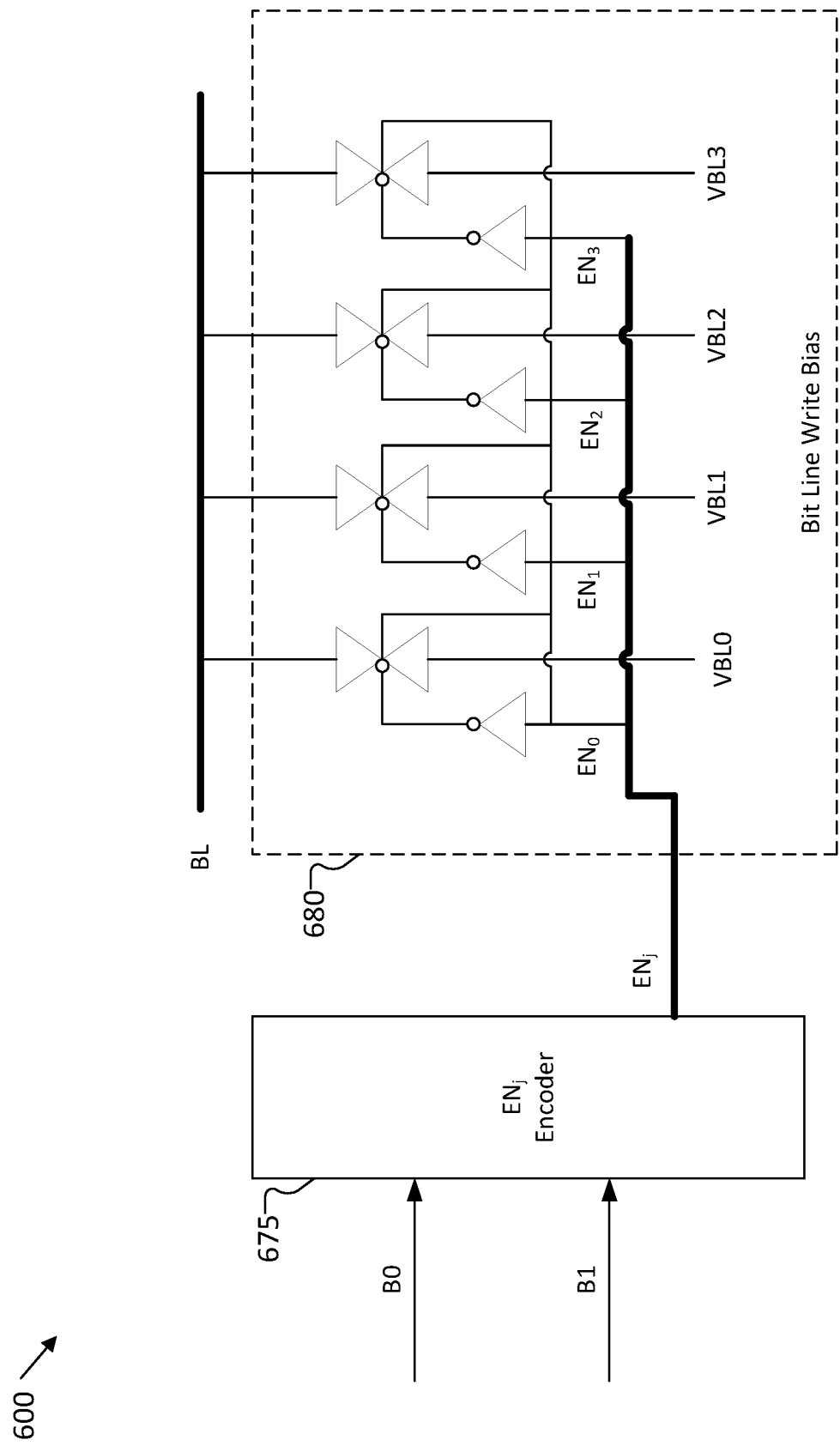
FIG. 6 shows an exemplary bias selection circuit for selecting a write bias voltage that may be used to set the voltage across a multilevel state-programmable memory element.

An exemplary implementation of circuitry for such a write-back operation is shown in FIG. 6, where the output of the decoder (e.g., lines B0, B1 of decoder 570 as shown in FIG. 5, representing the read state) may be fed into a bias selection circuit 680 to select (e.g., via an enable line $EN_j$, where j corresponds to the particular state to be programmed) a write bias voltage (e.g. a bit line bias voltage) used to set the voltage across the multilevel state-programmable memory element to a level that is sufficient to program it to the previously-read state. For example, the bit line bias voltage may be provided in combination with other voltages (e.g., a plate line voltage) to apply a write voltage across the state-programmable memory element (referring, for example to FIG. 2, where the bit line (BL) voltage and plate line (PL) voltage define the voltage across the ferroelectric capacitor 305). The write bias voltage will vary depending on the state that is to be written back, and in the example of FIG. 6, it is one of four different voltages (VBL0, VBL1, VBL2, VBL3, collectively $VBL_j$), each of which corresponds to programming a different one of the remanently-programmable states of the state-programmable memory element. The enable line may be provided to the bias selection circuit 680 from an encoder 675 that may determine, based on the output of the decoder (e.g., lines B0, B1 of decoder 570 as shown in FIG. 5) which of the four different voltages corresponds to the previously-read state. As should be appreciated, while the bias voltages are shown in FIG. 6 as being supplied via four pass-gates, other implementations are possible and within the scope of this disclosure. For example, if VBL0 is zero volts (e.g., so that VPL−VBL=0 to write the state associated with a minimum switching charge of zero) and VBL3 is Vr>=Vdd (e.g., so that the maximum switching charge is +2Pr, where Pr is the predefined read polarization state (e.g., +P1)), then the pass gate to VBL0 can be a simple nMOS and the pass gate connected to VBL3 can be a simple pMOS.

Figure 7:
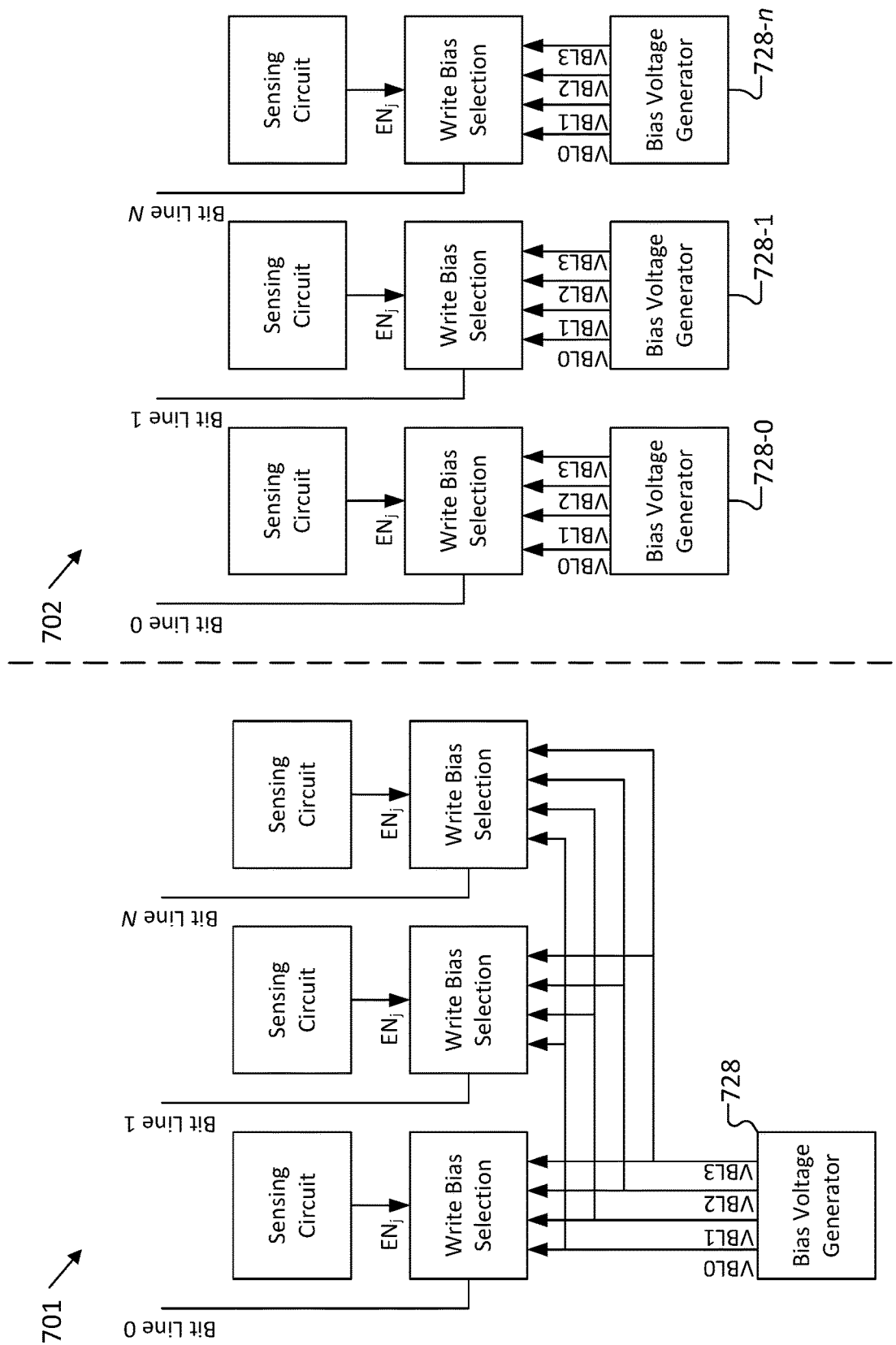
FIG. 7 shows exemplary circuit diagrams of a global bias voltage generator and local bias voltage generators that may be used for generating the bias voltages that may be used in a write-back or write operation.

As should be appreciated, the different voltages (VBL0, VBL1, VBL2, VBL3, collectively $VBL_j$) may be generated globally (e.g., for a global set of bit lines) and provided to the bias selection circuit (e.g., bias selection circuit 680) that selects the appropriate bias voltage based on the output of the decoder (e.g., $EN_j$) for the memory cell. Alternatively, the different voltages may be generated locally at each bias selection circuit (e.g., for each bias selection circuit 680). An example of globally generated voltages are shown in circuit 701 of FIG. 7 for a set of bit lines (e.g., bit line 0 to bit line N), and an example of locally generated voltages is shown in circuit 702 of FIG. 7. In circuit 701, a global bias voltage generator 728 supplies the reference voltage(s) (e.g., VBL0, VBL1, VBL2, VBL3 in this example) to each of the bias selection circuits. In circuit 702, the reference voltage(s) are generated locally at the bias selection circuit for each bit line, where bias selection circuit for bit line 0 receives reference voltages from bias voltage generator 728-0, bias selection circuit for bit line 1 receives reference voltages from bias voltage generator 728-1, and the remaining bit lines N each receives a set of reference voltages from its associated bias voltage generator 728-n.

As noted earlier, the selected bit line bias voltage may be provided in combination with other voltages (e.g., a plate line voltage) to apply a write voltage across the state-programmable memory element, where, for example with respect to FIG. 2, the bit line (BL) voltage and plate line (PL) voltage define the voltage across the ferroelectric capacitor 305 ($V_{AB}$=VPL−VBL). In such an architecture for the array of memory cells, the plate lines may run parallel to the word lines and the plate lines are therefore common to the plurality of cells that have been read-out (e.g., in the read operation described above), and therefore the plate line voltage biases the array and the plate line cannot be biased independently for an individual cell. Of course, any type of architecture for connecting the control lines (e.g., word line, bit line, plate line, etc.) to each cell, either in groups or individually, may be used. In general, the write voltage biasing circuit operates in combination with the control lines for operating the array to ensure that the proper programming voltages are applied across the selected state-programmable memory element to write back the previously-read state.

Various techniques may be used for reading and writing-back the read state, and two example methods are discussed below. As should be understood, however, any method may be used for reading the stored state in a read operation and then writing back the read state in a write operation. A first exemplary method (e.g., "method 1" as illustrated with an example with respect to FIG. 9 and FIGS. 14-15 discussed in more detail below) may, during the write operation, apply a bias voltage across the state-programmable memory element that is opposite to the voltage applied across it during the read operation. In other words, if $V_{AB}$ is applied during the read operation, then $-V_{AB}$ is applied during the write-back operation. In such a case, because the write operation uses a negative bias, only bit line voltage (BL) may need to be managed, keeping the plate line (PL) grounded after the read operation is completed. This method may be faster, but it could also have drawbacks in terms of reliability, especially if a voltage sensing scheme is used instead of a charge sensing scheme (e.g., as discussed above with respect to FIGS. 2 and 3). In fact, there may be no need to write the +P1 state after reading out a positive state, and cells that were in the +P1 state during the read operation may need not necessarily be re-written during the write operation. Not re-writing the +P1 state, however, may impact reliability because this means the +P1 state may be written fewer times as compared to the other states.

A second exemplary method (e.g., "method 2" as illustrated with two examples with respect to FIGS. 10-11, FIGS. 16-17, and discussed in more detail below) may apply, during the write operation, a bias voltage across the state-programmable memory element with a bias direction that is either the same or opposite to the bias applied for the read operation (e.g., both a positive and a negative bias across the state-programmable memory element), managing, for example, a positive or a negative bit line voltage while keeping the plate line grounded or managing both bit line and plate line voltages after the read is completed to set the write bias voltage across the state-programmable memory element.

Figure 8:
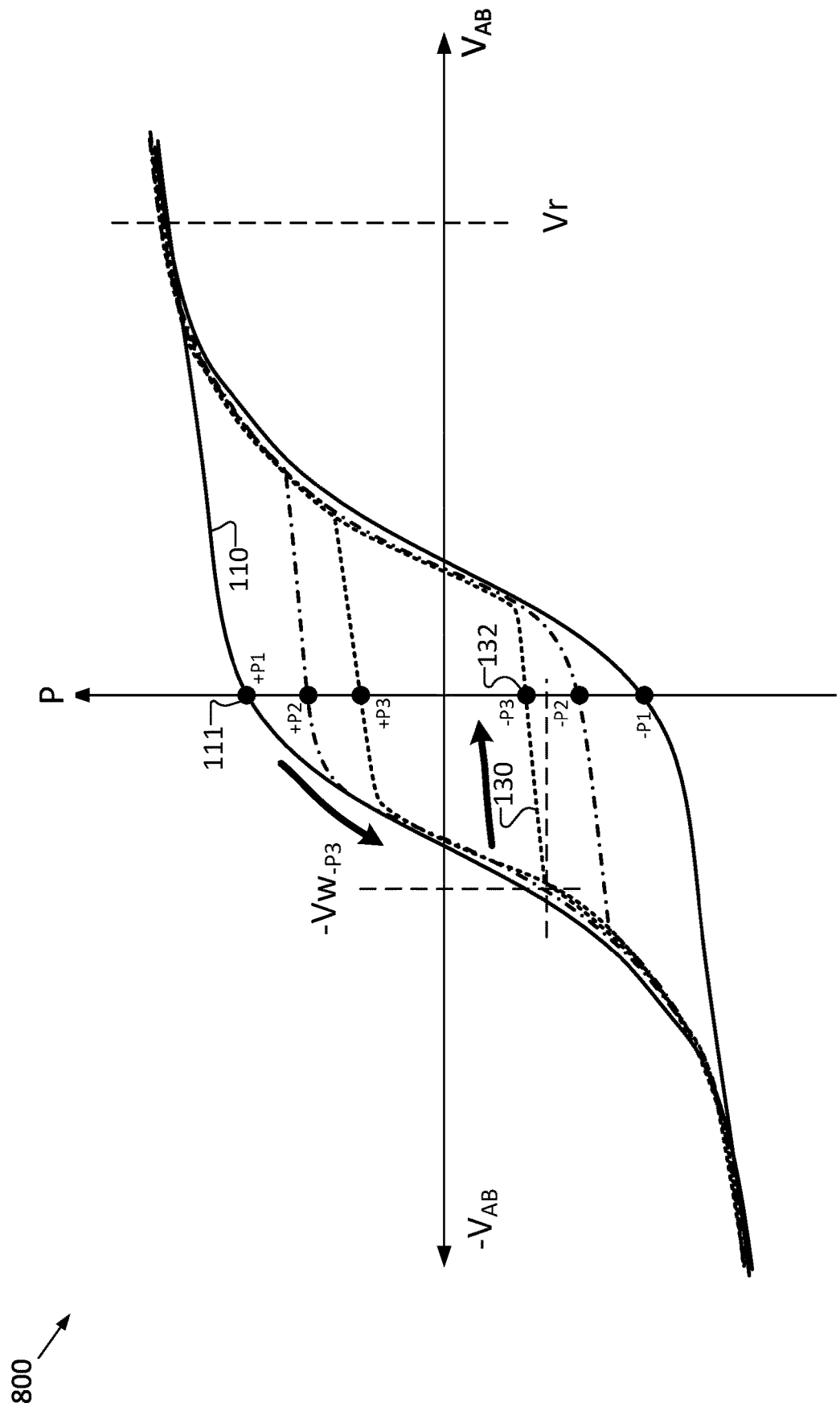
FIGS. 8-11 each show an exemplary graph of the polarization of a multilevel state-programmable memory element as a function of the voltage applied across it and how it may transition from one state to another state.

An example of what may happen to the polarization of a state-programmable memory element during a read operation and write-back operation is shown in FIG. 8, where the state-programmable memory element is programmable to six different remanent states (e.g., as discussed above with respect to FIGS. 1A-1C). During a read operation, a read voltage is applied (Vr) such that the voltage across the state-programmable memory element programs it to a pre-defined read state (e.g., state 111, +P1). After the read operation (and after the associated sensing of the switching charge to determine the read state), the state-programmable memory element will have been programmed to state 111 (+P1). If the read state was the one of the negative states (e.g., state 132 (-P3)), this may be written back to the state-programmable memory element by applying a negative voltage across the state-programmable memory element (e.g., $-V_{W-P3}$) sufficient to program the -P3 remanent state 132 (as discussed, for example, above with respect to $-Vs_3$ of FIG. 1B, following hysteresis curves 110 and 130 to reach state 132). If the read state was one of the other negative states (e.g., states -P2 or -P1), these may be set by applying as the write-back voltage a negative voltage sufficient to program the corresponding state.

Figure 9:
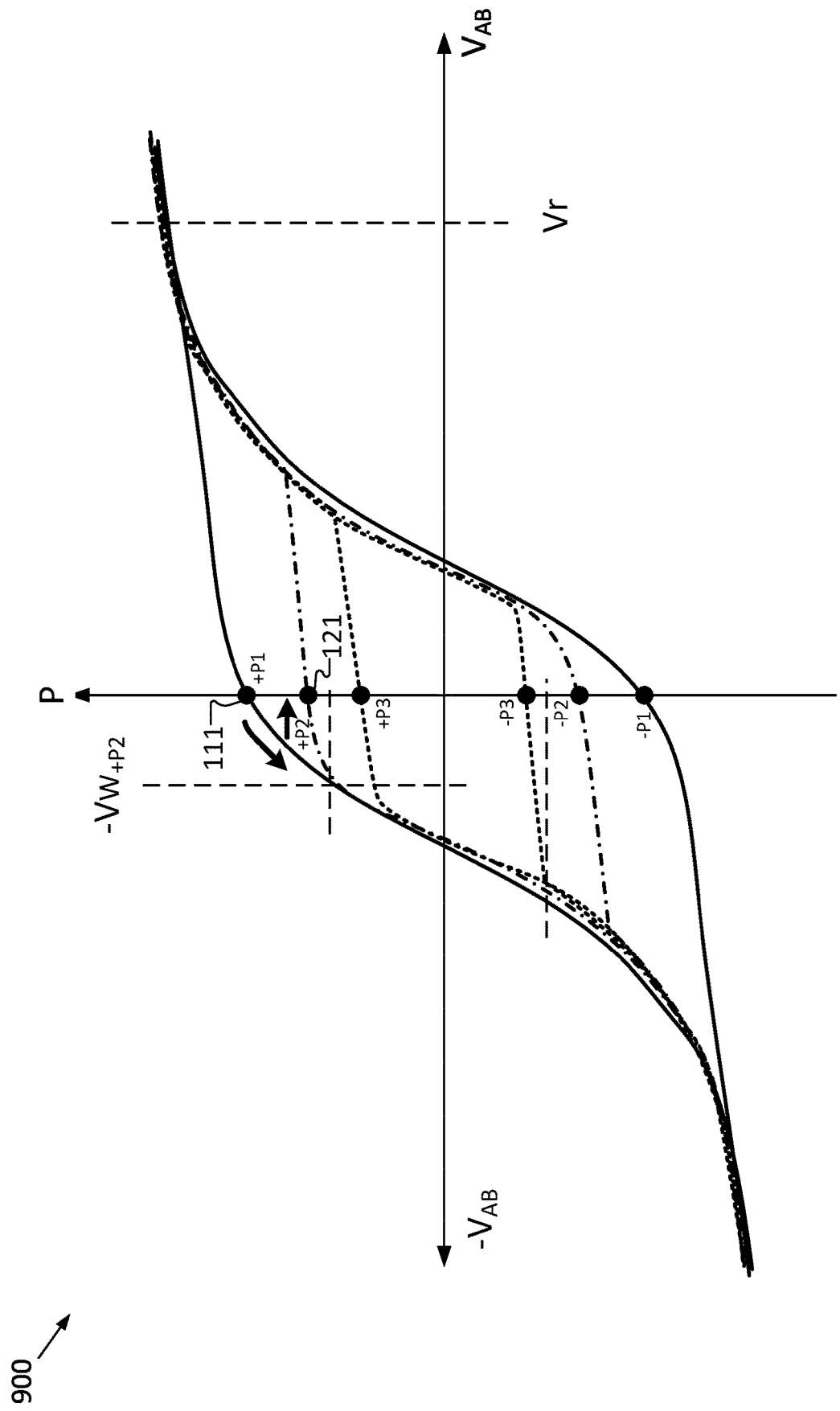

If the read state was one of the positive states (e.g., +P1, +P2, +P3), different options are available for writing back these states. For example, if the read state is the +P1 state (state 111), then no write-back is necessary because the read operation already wrote the state-programmable memory element to the +P1 state (e.g., as the predefined read state). As should be appreciated, a positive voltage could be applied that is sufficient to re-write the +P1 state (e.g., re-applying the read voltage), which may incur costs in terms of time and a positive voltage supply, but it may also be beneficial in that regardless of the read state, the state-programmable memory element is always re-written after a read operation. If the read state is the +P2 state or +P3 state, then a negative voltage may be applied that is sufficient to program the corresponding state. As should be appreciated, while this applied voltage is negative, it must be less than the negative coercive voltage. As shown in FIG. 9 for example, if the read state is the +P2 state (state 121), then a negative voltage of $-V_{W+P2}$ may be applied across the state-programmable memory element that is sufficient to program the +P2 remanent state 121 (as discussed, for example, above with respect to $-Vs_2$ of FIG. 1B).

Figure 10:
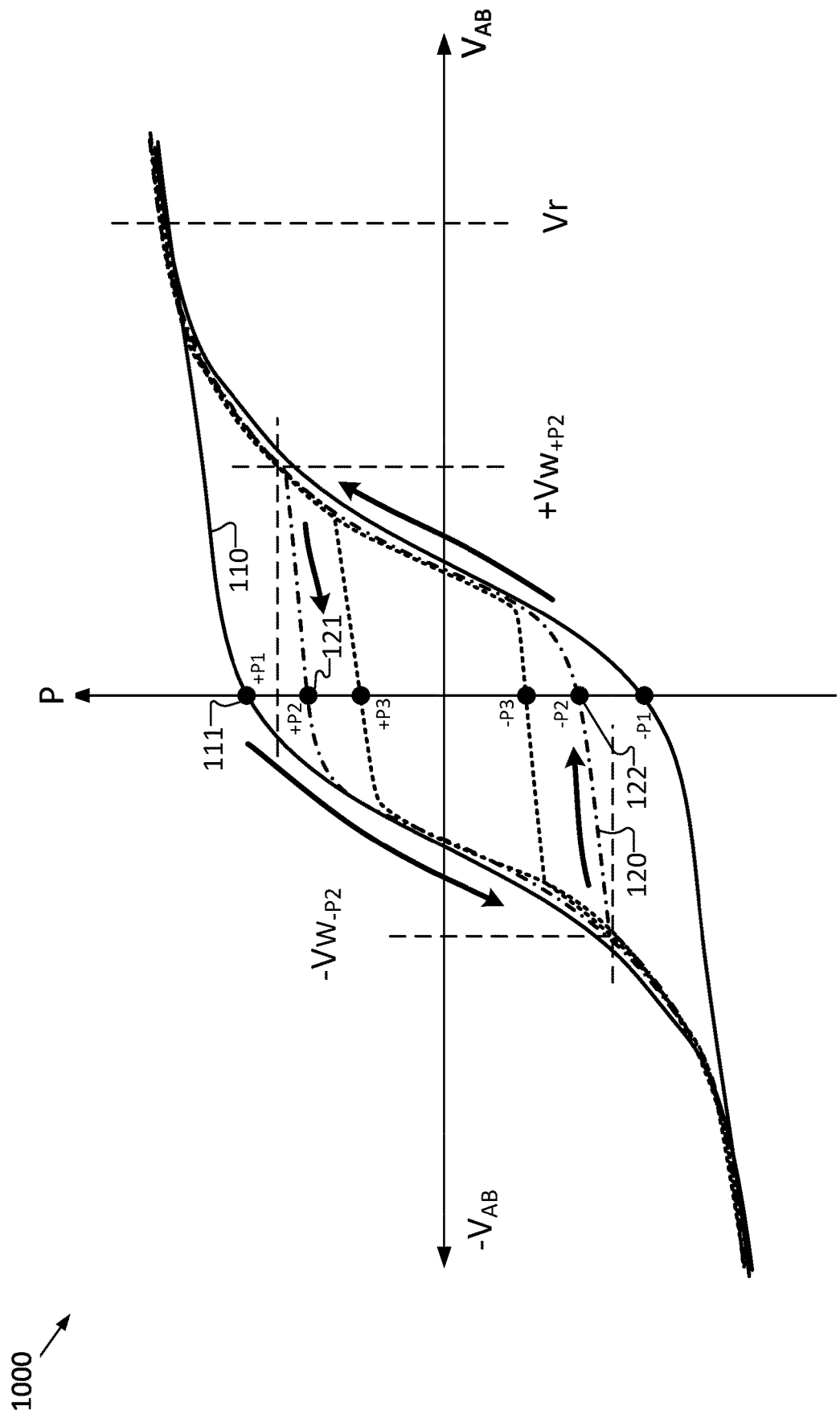

Alternatively, a positive state may be set by first applying a negative voltage (e.g., a pre-bias voltage) that is sufficient to program the state-programmable memory element to one of the negative states (e.g., higher than the negative coercive voltage) and then applying a positive voltage (e.g., higher than the positive coercive voltage) (e.g., the write bias voltage) that is sufficient to program the state-programmable memory element to the positive state corresponding to the read state. An example of this is shown in FIG. 10, where the write operation first applies a pre-bias voltage of $-V_{W-P2}$ that is higher than the negative coercive voltage and sufficient to program the -P2 state (state 122 associated with hysteresis 120). Thereafter, a positive write voltage may be applied that is higher than the positive coercive voltage and sufficient to program the +P2 state (state 121). The arrows in FIG. 10 show the path along the hysteresis curves as the negative voltage is first applied (to program the negative remanent state) and then as the positive voltage is next applied (to program the positive remanent state).

Figure 11:
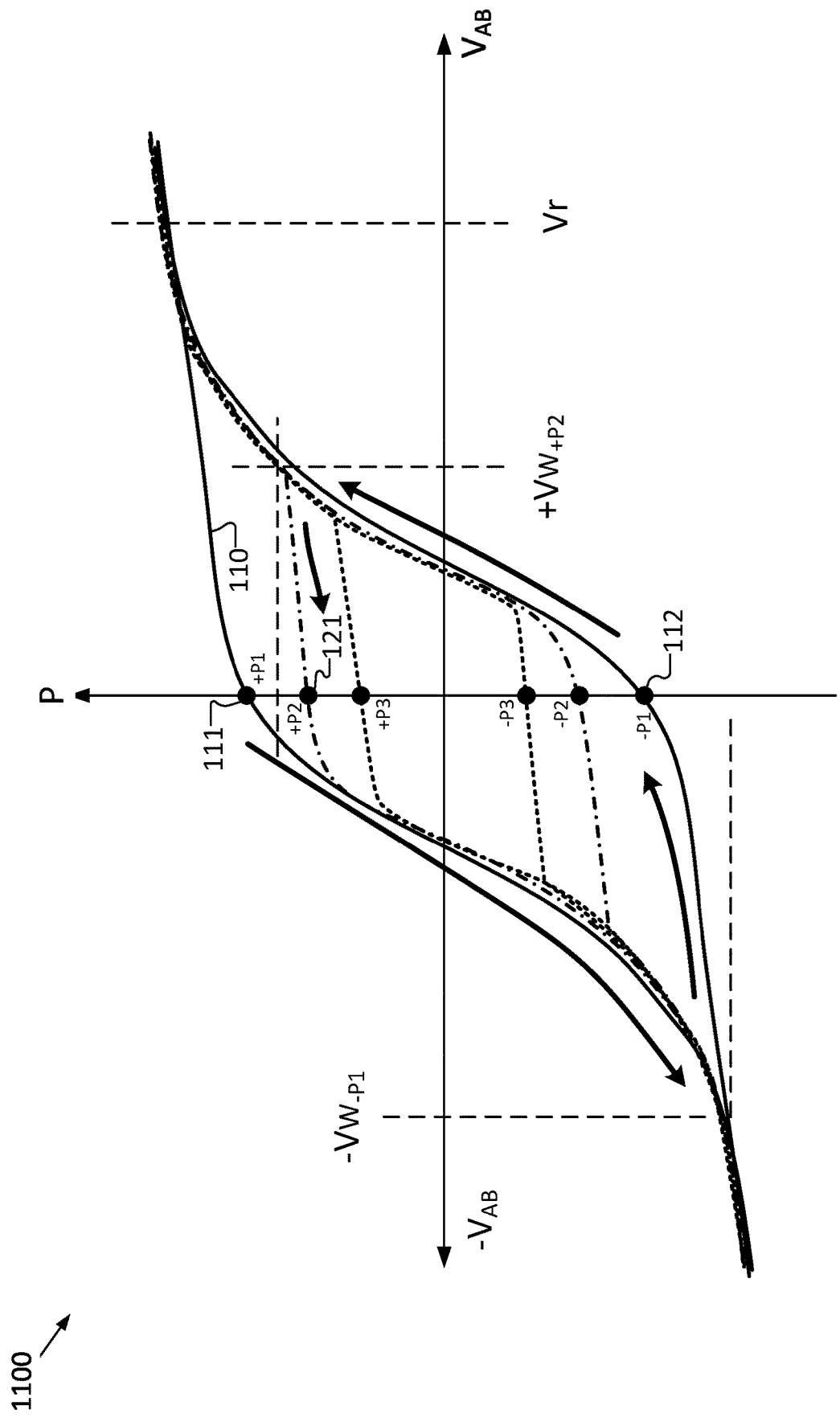

A different example of this negative-then-positive write-back operation is shown in FIG. 11, where the applied voltages cause a different path along a different hysteresis curve (e.g., the outer-most hysteresis curve associated with -P1 (state 112)). In this case, the write operation first applies a pre-bias voltage of $-V_{W-P1}$ that is higher than the negative coercive voltage and sufficient to program the -P1 state (state 112 associated with hysteresis 110). Thereafter, a positive write voltage may be applied that is higher than the positive coercive voltage and sufficient to program the +P2 state (state 121). The arrows in FIG. 11 show the different path along the hysteresis curves that now moves through the -P1 state (state 112). Using a negative-then-positive type of write-back operation may be helpful for reducing the imprint of the positive states because it ensures that the state-programmable memory element travels through a complete hysteresis loop to re-write a positive state.

Figure 12:
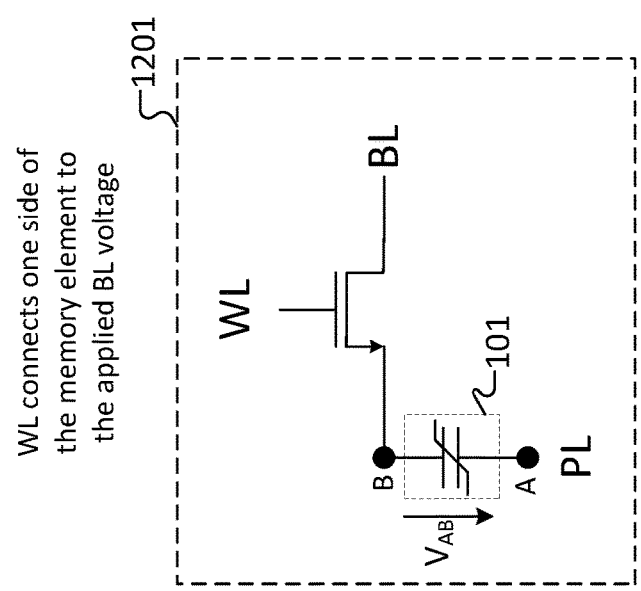
FIG. 12 shows an exemplary circuit diagram of a memory cell that may include a multilevel state-programmable memory element.

Example timing diagrams for exemplary read and write-back operations are discussed below with reference to a memory array (e.g., shown in FIG. 13) comprised of multilevel memory cells (e.g., shown in FIG. 12) that are state-programmable to at least 4 different states. Each multilevel state-programmable memory element may be configured as shown in FIG. 12, where memory cell 1201 includes a multilevel state programmable memory element 101 (e.g., a FeCAP), with one side (B) connected to a plate line voltage (PL) and the other side (A) connectable to the bit line voltage (BL), selected by a word line (WL) control signal. Thus, the voltage across the state-programmable memory element $V_{AB}$ may be the voltage applied on PL minus the voltage applied on BL (e.g., VPL−VBL).

Figure 13:
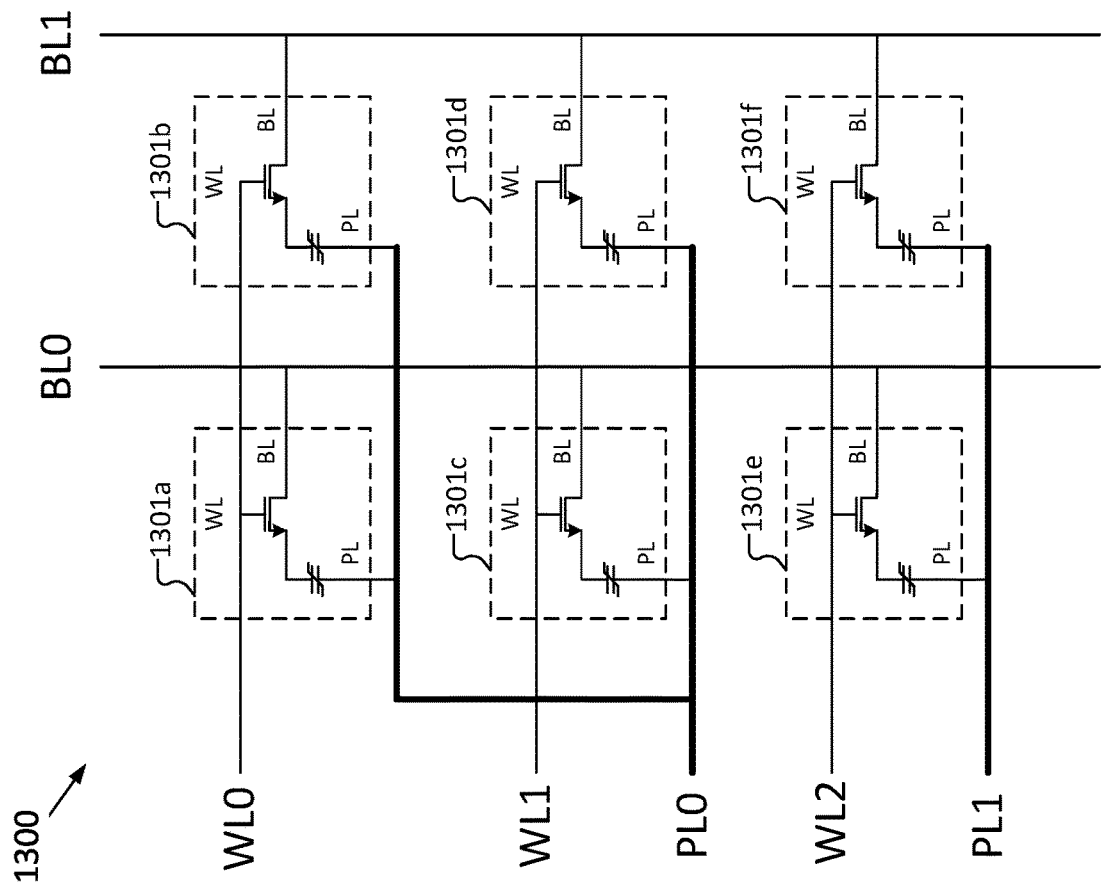
FIG. 13 shows an exemplary circuit diagram of a memory array that may include a plurality of memory cells, each of which includes a multilevel state-programmable memory element.

FIG. 13 shows a memory array 1300 that includes of a number of memory cells 1301a-1301f (e.g., each configured like memory cell 1201) and grouped by bit lines, word lines, and plate lines. For example, the BL for each memory cell in the first column of memory cells (e.g., memory cell 1301a, 1301c, 1301e) is connected to bit line zero (BL0) while the BL for each memory cell in the second column (e.g., memory cell 1301b, 1301d, 1301f) is connected to bit line one (BL1). Word line zero (WL0) connects the WL of each memory cell in the first row (e.g., memory cell 1301a, 1301b), word line one (WL1) connects the WL of each memory cell in the second row (e.g., memory cell 1301c, 1301d), and word line two (WL2) connects the WL of each memory cell in the first row (e.g., memory cell 1301e, 1301f). The memory array 1300 is divided into two plates, where plate line zero (PL0) connects the PL of each memory cell in the first plate (e.g., memory cells 1301a, 1301b, 1301c, 1301d) and plate line one (PL1) connects the PL of each memory cell in the second plate (e.g., memory cells 1301e, 1301f).

As discussed above with respect to the read operation and FIGS. 2 and 3, a sensing scheme may detect the switching charge transferred from the state-programmable memory element to the sensing circuit as part of the read operation. The sensed switching charge may be associated with one of the at least four different remanent states of the memory element and a binary code the state represents, as discussed above. For the example diagrams that follow, the charge difference, its corresponding binary code, and the bit line voltage VBL is defined by the table below, where the VBL is one of four different voltages (VBL0, VBL1, VBL2, VBL3) applied to the bit line during write-back operations for writing-back the read state. Two different VBL voltage schemes are shown below, one for each of the different write-back methods for method 1 (see FIG. 9 and FIGS. 14-15) and method 2 (see FIGS. 10-11 and FIGS. 16-17) introduced above and discussed below with respect to the examples of FIG. 9-11:

| Charge Difference | Binary Code | VBL | Method 1 | Method 2 |
|---|---|---|---|---|
| Qsw3 | 1 0 | VBL3 | VBL3 | VBL3 |
| Qsw2 | 1 1 | VBL2 | ⅔ VBL3 | ½ VBL3 |
| Qsw1 | 0 1 | VBL1 | ⅓ VBL3 | −½ VBL3 |
| Qsw0 | 0 0 | VBL0 | 0 | 0 |

In the table above, the plate line is assumed to be grounded during the write-back operation such that the voltage across the state-programmable memory element (VPL−VBL) is simply −VBL. As should be appreciated, however, instead of grounding the plate line during the write-back operation, the voltage on the plate line may be greater than zero so that there is no need to generate a negative VBL (e.g., when writing the state associated with Qsw1 using method 2). With this table in mind, the timing diagrams for exemplary read operations and write-back operations of a memory array (e.g., the memory array of FIG. 13) are discussed below with respect to FIGS. 14 and 17, where WL is the word line voltage, PL is the plate line voltage, BL is the bit line voltage, PRC is a pre-charge signal that may be used to pre-charge the BL to zero volts, STB #is a strobe signal that may be used for operating the comparator circuitry (e.g., comparators 505 and 509 of comparator 550 of FIG. 5), OUT0 is the output of the first comparator (e.g., comparator 505) and OUT1 is the output of the second comparator (e.g., comparators 509) that are the inputs to the decoder (e.g., decoder 570), and $EN_j$ is the output of the encoder (e.g., encoder 680 of FIG. 6) used to select the bit line write bias.

Figure 14:
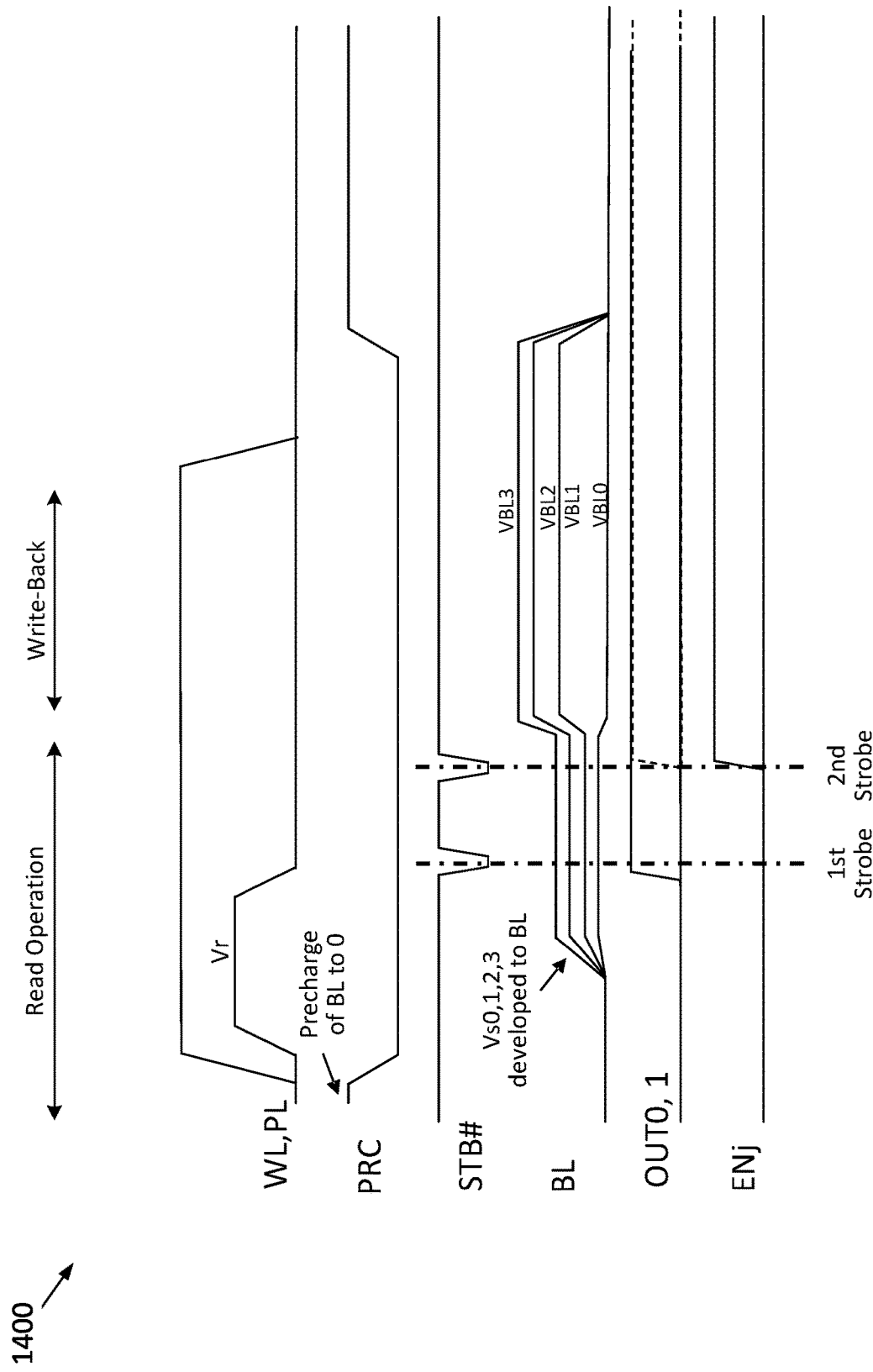
FIGS. 14-17 each show a timing diagram for performing a read operation and a write-back operation for a memory cell that includes a multilevel state-programmable memory element.

FIG. 14 shows an exemplary timing diagram 1400 for a read operation and a write-back operation according to method 1, where only negative voltages across the state-programmable memory element (VPL−VBL) are needed for the write operation, where PL is grounded during the write operation. Before the read operation, the BL is pre-charged to zero volts and then during the read operation, a read voltage of Vr is applied to the plate line to program the state-programmable memory element to the predefined read state of +P1. A charge is developed onto the BL from the state-programmable memory element and converted to a sensed voltage (e.g., $V_{s,0}$, $V_{s,1}$, $V_{s,2}$, $V_{s,3}$) and transferred for comparison to reference voltages associated with each state. A comparison is done at a first strobe time and a second strobe time to obtain the outputs OUT0 and OUT1 that are then decoded to obtain the binary code associated with the read state. During the write-back operation, the binary code associated with the read state is encoded to enable the selection signal ENj for selecting one of the four VBL voltages (VBL0, VBL1, VBL2, or VBL3, depending on the read state) to apply to the BL for writing-back the read state.

Figure 15:
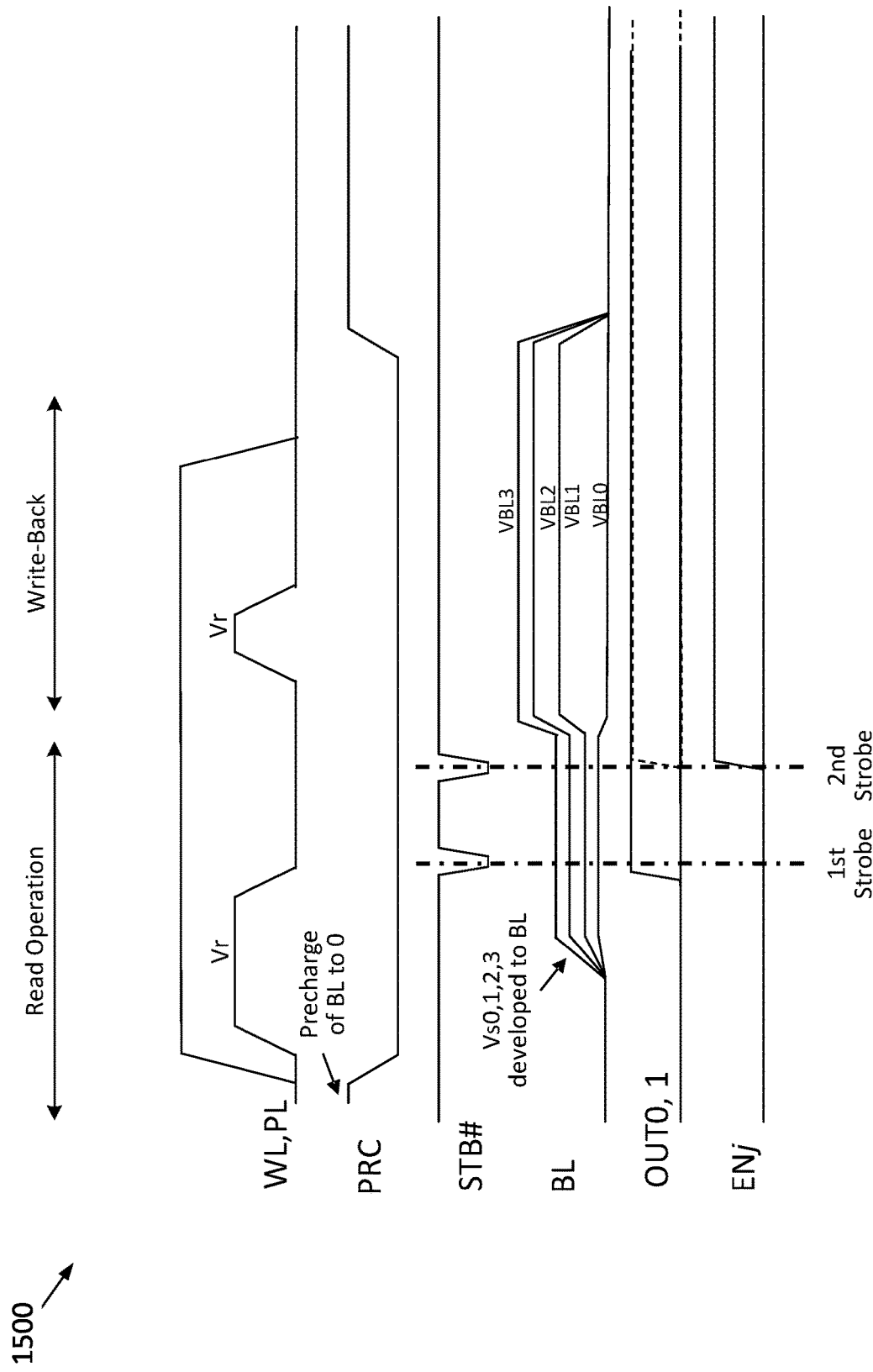

FIG. 15 shows an exemplary timing diagram 1500 for a read operation and a write-back operation according to method 1 that is similar to timing diagram 1400, except that after the read operation and before the write-back operation, the read voltage (Vr) is again applied to the PL in order to refresh the +P1 state before the write-back operation. A refresh of the +P1 state may occur here by keeping the BL biased to zero volts such that entire read voltage (Vr) is applied across the state-programmable memory element. It should be noted that for the refresh, the voltage across the state-programmable memory element may be different than that of the read operation, where the sensed voltage developed to the BL from the state-programmable memory element is below Vr (for example, when reading the +P1 state, the voltage developed to BL is Vr−Vs,0).

Figure 16:
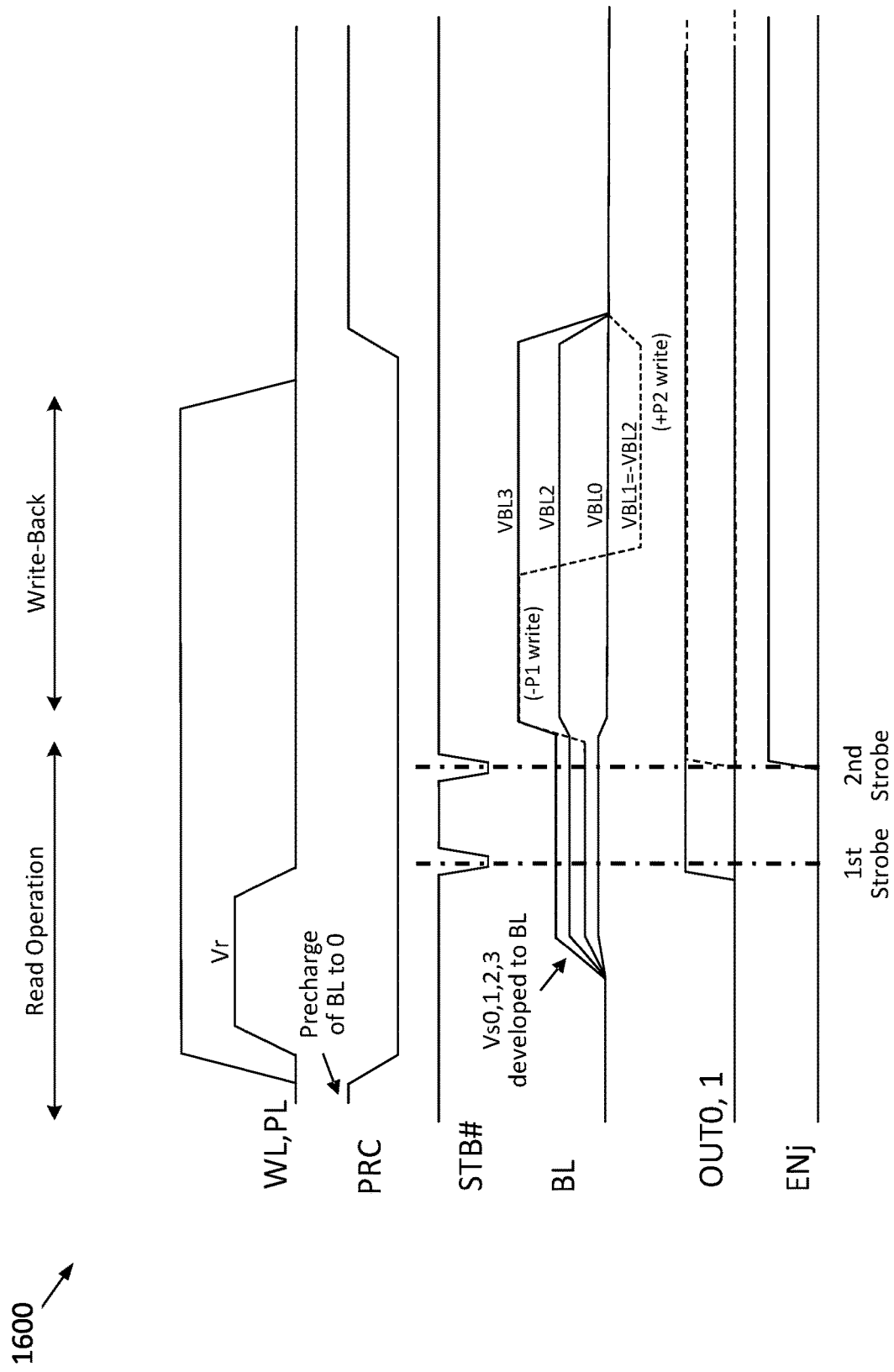

FIG. 16 shows an exemplary timing diagram 1600 for a read operation and a write-back operation that is similar to timing diagram 1400, except that timing diagram 1600 is for method 2, where both a negative voltage and a positive voltage are used during the write operation. As discussed above with respect to FIGS. 10-11, before writing-back a positive state (e.g., +P2), a negative state may be first written (e.g., −P1) so that the polarization follows a complete hysteresis loop to re-write a positive state. Also in this example, the PL is again grounded such that in order to write-back at least one of the four states, a VBL of less than zero may be required (see the previous table and the negative charge difference associated with Qsw1). This negative voltage for VBL can be seen in timing diagram 1400 at VBL1, which is equal to −VBL2.

Figure 17:
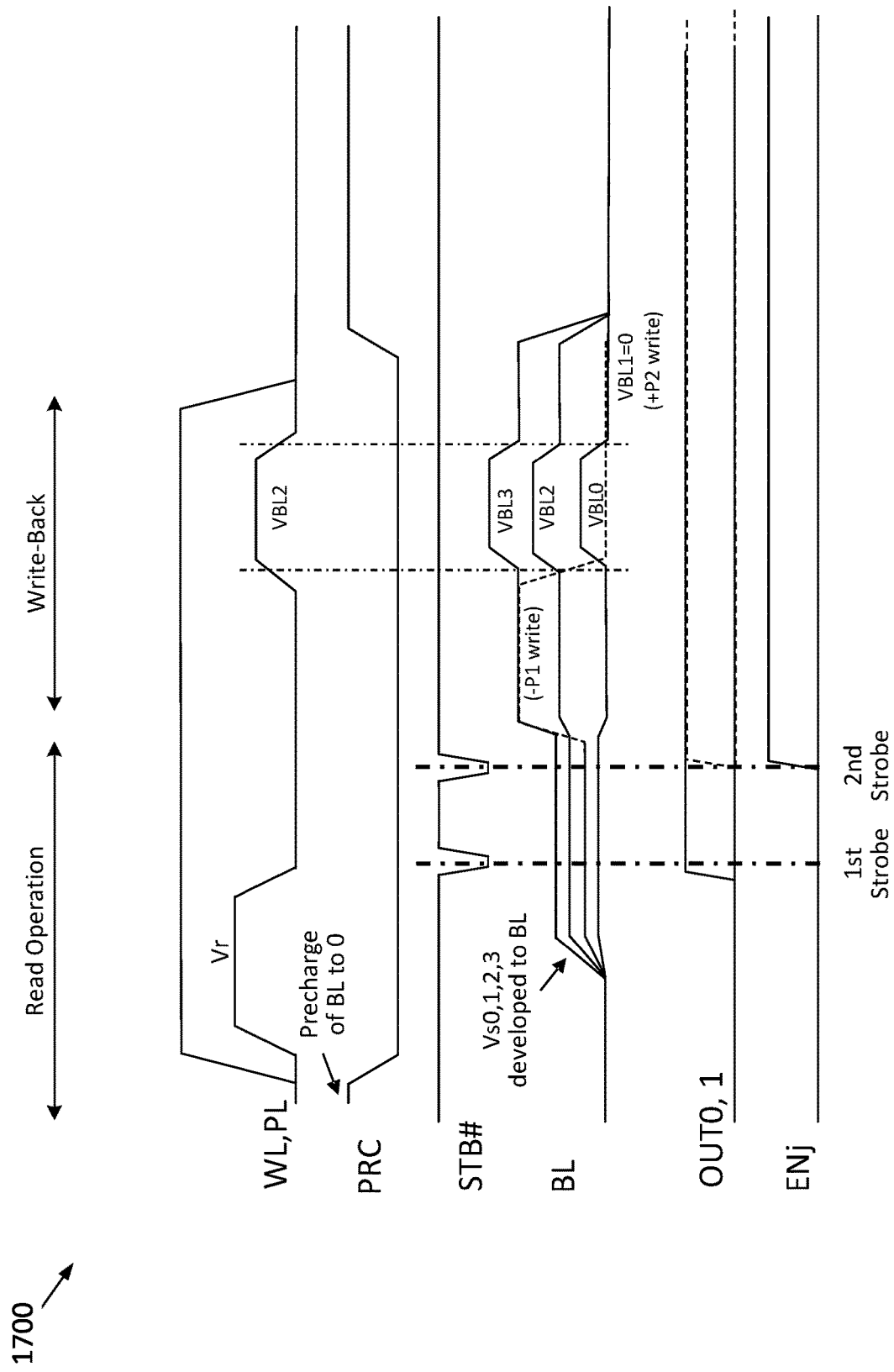

FIG. 17 shows an exemplary timing diagram 1700 for a read operation and a write-back operation using method 2 that is similar to timing diagram 1600, except that the PL is not grounded and instead may set to a value greater than zero so that none of the VBL voltages need to be less than zero. As can be seen in FIG. 17, the PL voltage is set to VBL2 during the write-back operation so that a negative voltage is not needed on the BL. Instead, the BL may be set to one of VBL0+VBL2, 2VBL2, VBL3+VBL2.

Figure 18:
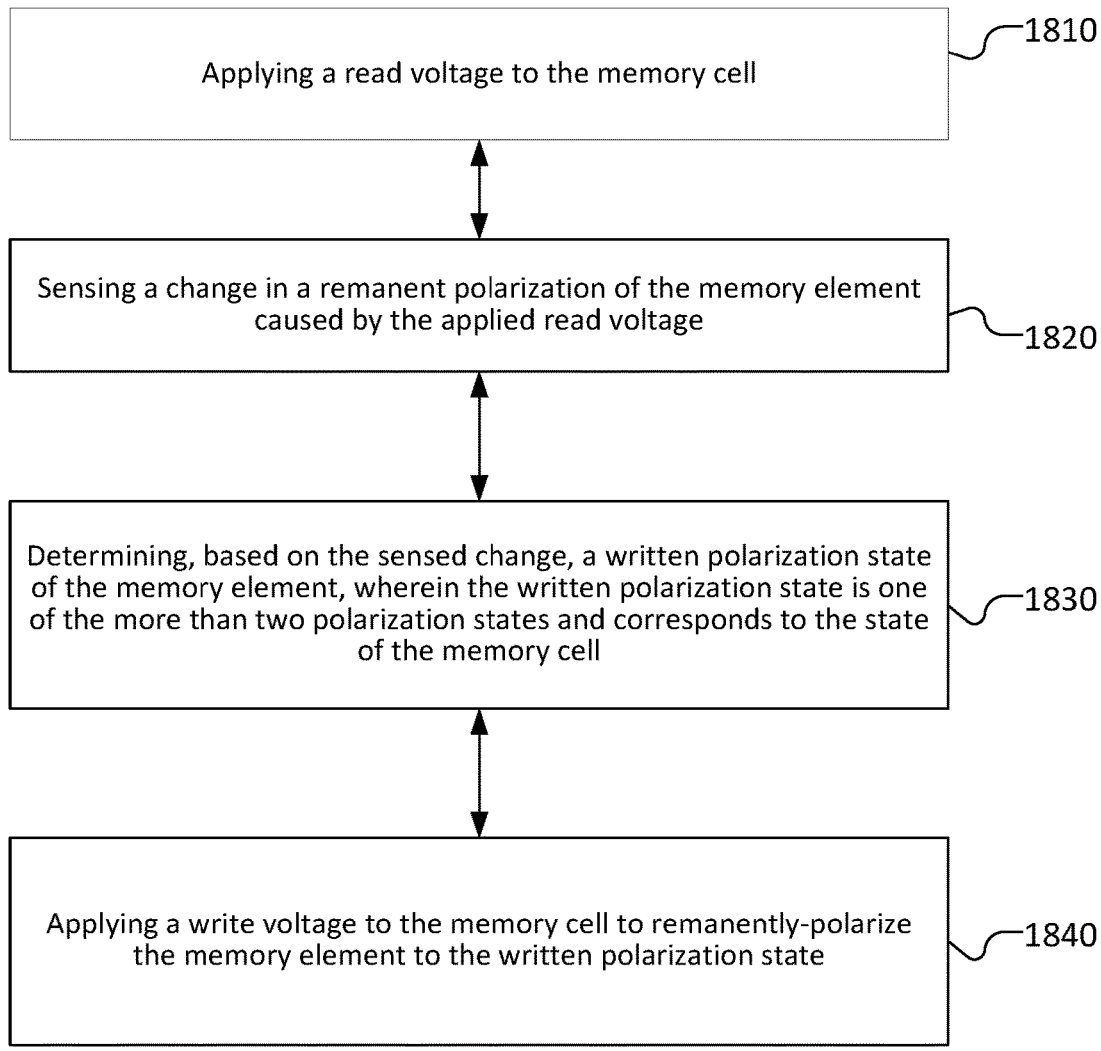
FIG. 18 depicts an exemplary schematic flow diagram of a method for operating a memory that includes a multilevel state-programmable memory element.

FIG. 18 depicts an exemplary schematic flow diagram 1800 of a method for reading out and writing back a state of a memory cell that includes a memory element that is remanently-polarizable to more than two polarization states. Method 1800 may implement any of the features and/or structures described above with respect to the state-programmable memory element and associated circuits described above with respect to FIGS. 1-17.

Method 1800 includes, in 1810, applying a read voltage to the memory cell, sensing a change in a remanent polarization of the memory element caused by the applied read voltage. Method 1800 also includes, in 1820, determining, based on the sensed change, a stored polarization state of the memory element, wherein the stored polarization state is one of the more than two polarization states and corresponds to the state of the memory cell. Method 1800 also includes, in 1830, applying a write voltage to the memory cell to remanently-polarize the memory element to the stored polarization state.

In the following, various examples are provided that may include one or more aspects described above with reference to a multilevel state-programmable memory element. It may be intended that aspects described in relation to the circuits may apply also to the described method(s), and vice versa.

Example 1 is a memory including a memory element that is writable to at least three different remanent polarization states. The memory also includes a sensing circuit configured to determine, in a read operation, a stored state of the memory element from among the at least three different remanent polarization states based on a sensed change in a remanent polarization of the memory element caused by an applied read voltage. The method also includes a biasing circuit configure to, in a write operation, apply a bias voltage level across the memory element to (re)write the memory element to the stored state.

Example 2 is the memory of example 1, wherein each corresponding state of the at least three different remanent polarization states is associated with a corresponding remanent polarization of the memory element in the corresponding state.

Example 3 is the memory of any one of examples 1 to 2, wherein the applied read voltage is configured to write the memory element to one of the at least three different remanent polarization states.

Example 4 is the memory of any one of examples 1 to 3, wherein the biasing circuit is configured to, as part of the write operation, apply a pre-bias voltage level across the memory element to write the memory element to a different state of the at least three remanent polarization states that is different from the stored state.

Example 5 is the memory of example 4, wherein the biasing circuit is configured to apply the pre-bias voltage level before the bias voltage level.

Example 6 is the memory of either of examples 4 or 5, wherein the at least three different remanent polarization states include at least one positive polarization state and at least one negative polarization state, wherein the stored state includes one of the at least one positive polarization state and the at least one a negative polarization state and the different state includes the other one of the at least one positive polarization state and the at least one negative polarization state.

Example 7 is the memory of any one of examples 1 to 6, wherein the biasing circuit includes a voltage generator that is capable of generating at least three distinct writing voltage ranges, each of which corresponds to a corresponding state of the at least three different remanent polarization states.

Example 8 is the memory of example 7, wherein the bias voltage level is within one of the at least three distinct writing voltage ranges that corresponds to the stored state.

Example 9 is the memory of any one of examples 1 to 8, wherein the sensing circuit includes a conversion circuit configured to convert the sensed change in the remanent polarization to a switching voltage.

Example 10 is the memory of example 9, wherein the conversion circuit includes an input capacitor, wherein the conversion circuit configured to convert the sensed change to a switching voltage by a current integration by the input capacitor.

Example 11 is the memory of either of examples 9 or 10, wherein the conversion circuit includes an integration amplifier.

Example 12 is the memory of any one of examples 9 to 11, wherein the sensing circuit includes a comparator circuit, wherein the sensing circuit configured to determine the stored state includes the comparator circuit configured to determine a voltage difference between the switching voltage to a reference voltage to determine the stored state based on the voltage difference.

Example 13 is the memory of example 12, wherein the comparator circuit includes a first comparator and a second comparator, wherein an output of the first comparator includes a selection input for selecting a second reference voltage as an input to the second comparator.

Example 14 is the memory of example 13, the memory further including a decoder to convert the output of the first comparator and an output of the second comparator to a unique bit combination that represents the stored state from among the at least three remanent polarization states.

Example 15 is the memory of example 14, the memory further including an encoder to convert the unique bit combination to a write bias voltage level for rewriting the stored state.

Example 16 is the memory of any one of examples 1 to 14, wherein the sensing circuit includes a comparator circuit, wherein the sensing circuit configured to determine the stored state includes the comparator circuit configured to compare the sensed voltage to at least three distinct voltage ranges, each of which corresponds to a corresponding state of the at least three remanent polarization states.

Example 17 is the memory of any one of examples 1 to 16, wherein the applied read voltage is defined by a bit line voltage and a plate line voltage of the memory that is connected to the memory element.

Example 18 is the memory of any one of examples 1 to 17, wherein the memory includes a plurality of memory elements that are configured to be biased by a bit line and a plate line connected to the plurality of memory elements, wherein the memory element is one of the plurality of memory elements.

Example 19 is the memory of example 18, wherein the bit line is connected to one node of the memory element and the plate line is connected to another node of the memory element, wherein the voltage across the memory element is defined from the one node to the other node and set by the applied bit line voltage and an applied plate line voltage on the plate line.

Example 20 is the memory of any one of examples 1 to 19, wherein the memory element is a multilevel ferroelectric capacitor.

Example 21 is the memory of any one of examples 1 to 20, wherein the applied read voltage is configured to cause a voltage drop across the memory element sufficient to write the memory element to one of the at least three different remanent polarization states.

Example 22 is a method for reading out and writing back a state of a memory cell, the memory cell including a memory element that is remanently-polarizable to more than two polarization states, the method includes applying a read voltage to the memory cell, sensing a change in a remanent polarization of the memory element caused by the applied read voltage determining, based on the sensed change, a stored polarization state of the memory element, wherein the stored polarization state is one of the more than two polarization states and corresponds to the state of the memory cell, and applying a write voltage to the memory cell to remanently-polarize the memory element to the stored polarization state.

Example 23 is the method of example 22, the method further including, after applying the read voltage and before applying the write voltage, causing a pre-voltage drop across the memory element sufficient to remanently-polarize the memory element to one of the more than two polarization states that is different from the stored polarization state.

Example 23 is the method of example 22, wherein each corresponding state of the more than two different polarization states is associated with a corresponding remanent polarization of the memory element in the corresponding state.

Example 24 is the method of any one of examples 22 to 23, wherein the applied read voltage writes the memory element to one of the at least three different remanent polarization states.

Example 25 is the method of any one of examples 22 to 24, wherein applying the write voltage includes applying a pre-bias voltage level across the memory element to write the memory element to a different state of the more than two polarization states that is different from the stored polarization state.

Example 26 is the method of example 25, wherein apply the pre-bias voltage level includes applying the pre-bias voltage level before the write voltage.

Example 27 is the method of either one of examples 25 or 26, wherein the more than two polarization states include at least one positive polarization state and at least one negative polarization state, wherein the stored polarization state includes one of the at least one positive polarization state and the at least one a negative polarization state and the different state includes the other one of the at least one positive polarization state and the at least one negative polarization state.

Example 28 is the method of any one of examples 22 to 27, wherein the method further includes generating at least three distinct writing voltage ranges, each of which corresponds to a corresponding state of the more than two different polarization states.

Example 29 is the method of example 28, wherein the write voltage is within one of the at least three distinct writing voltage ranges that corresponds to the stored polarization state.

Example 30 is the method of any one of examples 22 to 29, the method further including converting the sensed change in the remanent polarization to a switching voltage.

Example 31 is the method of example 30, the method further including converting the sensed change to a switching voltage by a current integration by the input capacitor.

Example 32 is the method of either of examples 30 or 31, wherein converting the sensed change is performed by an integration amplifier.

Example 33 is the method of any one of examples 30 to 32, wherein determining the stored state includes determining a voltage difference between the switching voltage to a reference voltage and includes determining the stored state based on the voltage difference.

Example 34 is the method of example 33, wherein the determining the stored state is performed by a first comparator and a second comparator, the method further including selecting a second reference voltage as an input to the second comparator based an output of the first comparator.

Example 35 is the method of example 34, the method further including converting the output of the first comparator and an output of the second comparator to a unique bit combination that represents the stored polarization state from among the more than two polarization states.

Example 36 is the method of example 35, the method further including converting the unique bit combination to a write bias voltage level for rewriting the stored state.

Example 37 is the memory of any one of examples 22 to 35, wherein determining the stored polarization state includes comparing the sensed voltage to at least three distinct voltage ranges, each of which corresponds to a corresponding state of the more than two polarization states.

Example 38 is the method of any one of examples 22 to 37, wherein applying the read voltage includes applying a plate line voltage and (eventually, optionally) a bit line voltage of the memory to the memory element.

Example 39 is the method of any one of examples 22 to 38, the method further including biasing a plurality of memory elements by a bit line and a plate line connected to the plurality of memory elements, wherein the memory element is one of the plurality of memory elements.

Example 40 is the method of example 39, the method further including connecting the bit line to one node of the memory element and connecting the plate line to another node of the memory element, wherein a voltage across the memory element is defined from the one node to the other node and wherein the method further includes applying the voltage across the memory element by the applied bit line voltage and an applied plate line voltage on the plate line.

Example 41 is the method of any one of examples 22 to 40, wherein the memory element is a multilevel ferroelectric capacitor.

Example 42 is the method of any one of examples 22 to 41, wherein applying the read voltage includes causing a voltage drop across the memory element sufficient to write the memory element to one of the more than two different polarization states.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory comprising:
   a memory element that is writable to at least three different remanent polarization states;
   a sensing circuit configured to determine, in a read operation, a stored state of the memory element from among the at least three different remanent polarization states based on a sensed change in a remanent polarization of the memory element caused by an applied read voltage configured to cause a voltage drop across the memory element sufficient to write the memory element to one of the at least three different remanent polarization states;
   a biasing circuit configure to, in a write operation, apply a bias voltage level across the memory element to write the memory element to the stored state.

2. The memory of claim 1, wherein each corresponding state of the at least three different remanent polarization states is associated with a corresponding remanent polarization of the memory element in the corresponding state.

3. The memory of claim 1, wherein the applied read voltage is configured to write the memory element to one of the at least three different remanent polarization states.

4. The memory of claim 1, wherein the biasing circuit is configured to, as part of the write operation, apply a pre-bias voltage level across the memory element to write the memory element to a different state of the at least three remanent polarization states that is different from the stored state.

5. The memory of claim 4, wherein the biasing circuit is configured to apply the pre-bias voltage level before the bias voltage level.

6. The memory of claim 4, wherein the at least three different remanent polarization states comprise at least one positive polarization state and at least one negative polarization state, wherein the stored state comprises one of the at least one positive polarization state and the at least one negative polarization state and the different state comprises the other one of the at least one positive polarization state and the at least one negative polarization state.

7. The memory of claim 1, wherein the biasing circuit comprises a voltage generator that is capable of generating at least three distinct writing voltage ranges, each of which corresponds to a corresponding state of the at least three different remanent polarization states.

8. The memory of claim 1, wherein the sensing circuit comprises a conversion circuit configured to convert the sensed change in the remanent polarization to a switching voltage.

9. The memory of claim 8, wherein the conversion circuit comprises an input capacitor, wherein the conversion circuit configured to convert the sensed change to a switching voltage by a current integration by the input capacitor.

10. The memory of claim 8, wherein the sensing circuit comprises a comparator circuit, wherein the sensing circuit configured to determine the stored state comprises the comparator circuit configured to:
    determine a voltage difference between the switching voltage to a reference voltage; and
    determine the stored state based on the voltage difference.

11. The memory of claim 10, wherein the comparator circuit comprises a first comparator and a second comparator, wherein an output of the first comparator comprises a selection input for selecting a second reference voltage as an input to the second comparator.

12. The memory of claim 11, the memory further comprising a decoder to convert the output of the first comparator and an output of the second comparator to a unique bit combination that represents the stored state from among the at least three remanent polarization states.

13. The memory of claim 12, the memory further comprising an encoder to convert the unique bit combination to a write bias voltage level for writing the stored state.

14. The memory of claim 1, wherein the sensing circuit comprises a comparator circuit, wherein the sensing circuit configured to determine the stored state comprises the comparator circuit configured to compare the sensed voltage to at least three distinct voltage ranges, each of which corresponds to a corresponding state of the at least three remanent polarization states.

15. The memory of claim 1, wherein the applied read voltage is defined by a bit line voltage and a plate line voltage of the memory that is connected to the memory element.

16. The memory of claim 1, wherein the memory comprises a plurality of memory elements that are configured to be biased by a bit line and a plate line connected to the plurality of memory elements, wherein the memory element is one of the plurality of memory elements.

17. The memory of claim 1, wherein the memory element is a multilevel ferroelectric capacitor.

18. A method for reading out and writing back a state of a memory cell, the memory cell comprising a memory element that is remanently-polarizable to more than two polarization states, the method comprising:
    applying a read voltage to the memory cell;
    sensing a change in a remanent polarization of the memory element caused by the applied read voltage;
    determining, based on the sensed change, a stored polarization state of the memory element, wherein the stored polarization state is one of the more than two polarization states and corresponds to the state of the memory cell; and
    applying a write voltage to the memory cell to remanently-polarize the memory element to the stored polarization state.

19. The method of claim 18, the method further including, after applying the read voltage and before applying the write voltage, causing a pre-voltage drop across the memory element sufficient to remanently-polarize the memory element to one of the more than two polarization states that is different from the stored polarization state.

20. A memory comprising:
- a memory element that is writable to at least three different remanent polarization states;
- a sensing circuit configured to determine, in a read operation, a stored state of the memory element from among the at least three different remanent polarization states based on a sensed change in a remanent polarization of the memory element caused by an applied read voltage;
- a biasing circuit configure to, in a write operation:
  - apply a pre-bias voltage level across the memory element to write the memory element to a different state of the at least three remanent polarization states that is different from the stored state; and
  - apply, after the pre-bias voltage level, a bias voltage level across the memory element to write the memory element to the stored state.

\* \* \* \* \*